United States Patent
Sultenfuss et al.

(10) Patent No.: US 9,912,187 B2
(45) Date of Patent: Mar. 6, 2018

(54) WIRELESS POWER TRANSMISSION ANTENNA WITH THERMALLY CONDUCTIVE MAGNETIC SHIELD AND METHOD THEREFOR

(71) Applicant: Dell Products, LP, Round Rock, TX (US)

(72) Inventors: Andrew T. Sultenfuss, Leander, TX (US); Travis C. North, Cedar Park, TX (US)

(73) Assignee: DELL PRODUCTS, LP, Round Rock, TX (US)

( * ) Notice: Subject to any disclaimer, the term of this patent is extended or adjusted under 35 U.S.C. 154(b) by 150 days.

(21) Appl. No.: 14/842,790

(22) Filed: Sep. 1, 2015

(65) Prior Publication Data
US 2017/0063132 A1    Mar. 2, 2017

(51) Int. Cl.
| | |
|---|---|
| H02J 7/00 | (2006.01) |
| H02J 7/02 | (2016.01) |
| H02J 7/04 | (2006.01) |
| H01F 38/14 | (2006.01) |
| H01F 27/36 | (2006.01) |
| H05K 9/00 | (2006.01) |
| H02J 50/23 | (2016.01) |

(52) U.S. Cl.
CPC .......... *H02J 7/025* (2013.01); *H01F 27/365* (2013.01); *H01F 38/14* (2013.01); *H02J 7/0042* (2013.01); *H02J 7/04* (2013.01); *H02J 50/23* (2016.02); *H05K 9/00* (2013.01)

(58) Field of Classification Search
CPC .......... H02J 7/005; H02J 7/025; H02J 7/0042; H01F 27/288; H01F 27/36; H01F 27/362; H01F 27/365
USPC ........................................................ 320/108
See application file for complete search history.

(56) References Cited

U.S. PATENT DOCUMENTS

| | | |
|---|---|---|
| 3,555,187 A | 1/1971 | Rowley |
| 5,528,424 A | 6/1996 | Lentz et al. |
| 5,545,966 A | 8/1996 | Ramos et al. |
| 5,852,903 A | 12/1998 | Astrizky |
| 6,381,135 B1 | 4/2002 | Prasher et al. |
| 6,396,241 B1 | 5/2002 | Ramos et al. |
| 8,766,484 B2 | 7/2014 | Baarman et al. |
| 8,917,511 B2 | 12/2014 | Yamamoto et al. |
| 9,451,723 B2 | 9/2016 | Lofy et al. |
| 9,592,397 B2 | 3/2017 | Hansen et al. |
| 2002/0109936 A1 | 8/2002 | Korbel et al. |
| 2003/0086829 A1 | 5/2003 | Livesay et al. |
| 2004/0139571 A1 | 7/2004 | Chang et al. |
| 2006/0162627 A1 | 7/2006 | Alger |
| 2007/0021271 A1 | 1/2007 | Held |

(Continued)

OTHER PUBLICATIONS

"Dell Mobile Computing Cart," Dell Quick Reference Guide for Models ERGITD-001 and ERGITD-002, Mar. 2014, pp. 1-13, http://www.ergotron.com/Dell.

(Continued)

*Primary Examiner* — Paul Dinh
(74) *Attorney, Agent, or Firm* — Larson Newman, LLP

(57) ABSTRACT

A carbon material and a magnetic material are incorporated at a magnetic shield included at a wireless power antenna. The magnetic shield shapes a magnetic flux field proximate to the magnetic shield. The carbon material conducts heat at the magnetic shield.

20 Claims, 31 Drawing Sheets

(56) References Cited

U.S. PATENT DOCUMENTS

| | | | |
|---|---|---|---|
| 2007/0049071 A1 | 3/2007 | Jackson et al. | |
| 2007/0244530 A1 | 10/2007 | Ren | |
| 2008/0013137 A1 | 1/2008 | Itoh | |
| 2008/0078530 A1 | 4/2008 | Chang et al. | |
| 2008/0079388 A1 | 4/2008 | Sarnowsky et al. | |
| 2008/0111518 A1 | 5/2008 | Toya | |
| 2009/0044934 A1 | 2/2009 | Malkov | |
| 2009/0096413 A1 | 4/2009 | Partovi et al. | |
| 2009/0105493 A1* | 4/2009 | Jang | C07C 51/412 556/141 |
| 2009/0212637 A1 | 8/2009 | Baarman et al. | |
| 2009/0212737 A1 | 8/2009 | Johnson et al. | |
| 2010/0019614 A1 | 1/2010 | Arend et al. | |
| 2010/0132410 A1 | 6/2010 | Nypelö et al. | |
| 2010/0245721 A1 | 9/2010 | Chang et al. | |
| 2011/0050164 A1 | 3/2011 | Partovi et al. | |
| 2011/0057891 A1 | 3/2011 | Ham et al. | |
| 2011/0193524 A1 | 8/2011 | Hazzard et al. | |
| 2012/0001496 A1 | 1/2012 | Yamamoto et al. | |
| 2012/0062175 A1 | 3/2012 | Miller et al. | |
| 2012/0087074 A1 | 4/2012 | Chen | |
| 2012/0105177 A1 | 5/2012 | McLaren et al. | |
| 2012/0113576 A1 | 5/2012 | Cooper et al. | |
| 2012/0149291 A1 | 6/2012 | Roderick et al. | |
| 2012/0256585 A1 | 10/2012 | Partovi et al. | |
| 2013/0038280 A1 | 2/2013 | Boundy et al. | |
| 2013/0088192 A1 | 4/2013 | Eaton | |
| 2013/0119926 A1 | 5/2013 | Lin | |
| 2013/0141037 A1 | 6/2013 | Jenwatanavet et al. | |
| 2013/0192653 A1 | 8/2013 | Watson et al. | |
| 2013/0214612 A1 | 8/2013 | Bae | |
| 2013/0223826 A1 | 8/2013 | Bruce et al. | |
| 2013/0278207 A1 | 10/2013 | Yoo | |
| 2013/0300204 A1 | 11/2013 | Partovi | |
| 2013/0311798 A1 | 11/2013 | Sultenfuss et al. | |
| 2013/0330663 A1* | 12/2013 | Kawasaki | G03G 5/10 430/57.1 |
| 2014/0002014 A1 | 1/2014 | Sultenfuss et al. | |
| 2014/0031606 A1 | 1/2014 | Hansen et al. | |
| 2014/0062392 A1 | 3/2014 | Lofy et al. | |
| 2014/0115766 A1 | 5/2014 | Muderlak et al. | |
| 2014/0125276 A1 | 5/2014 | Lampinen | |
| 2014/0132210 A1 | 5/2014 | Partovi | |
| 2014/0152099 A1 | 6/2014 | Boyd | |
| 2014/0152244 A1 | 6/2014 | Rautiainen | |
| 2014/0159656 A1 | 6/2014 | Riehl | |
| 2014/0177197 A1 | 6/2014 | Lampinen | |
| 2014/0184155 A1 | 7/2014 | Cha | |
| 2014/0191568 A1 | 7/2014 | Partovi | |
| 2014/0197784 A1 | 7/2014 | Boldt | |
| 2014/0209691 A1* | 7/2014 | Finn | G06K 19/07769 235/492 |
| 2014/0225560 A1 | 8/2014 | Walley et al. | |
| 2014/0226795 A1* | 8/2014 | Kitano | A61B 6/4283 378/189 |
| 2014/0231973 A1* | 8/2014 | Huang | H01L 23/49894 257/659 |
| 2014/0266025 A1 | 9/2014 | Jakubowski | |
| 2014/0266624 A1 | 9/2014 | Van Bosch et al. | |
| 2014/0306654 A1 | 10/2014 | Partovi | |
| 2014/0333256 A1 | 11/2014 | Widmer et al. | |
| 2014/0339911 A1 | 11/2014 | Abe | |
| 2014/0354220 A1 | 12/2014 | Liu | |
| 2015/0002103 A1 | 1/2015 | Tomiki et al. | |
| 2015/0202656 A1* | 7/2015 | Takahashi | H01L 41/0986 310/300 |
| 2015/0222017 A1 | 8/2015 | Kumura et al. | |
| 2015/0244182 A1 | 8/2015 | Ozana et al. | |
| 2015/0284288 A1 | 10/2015 | Ellison et al. | |
| 2016/0103071 A1* | 4/2016 | Wincheski | G01N 21/65 264/408 |
| 2016/0159233 A1 | 6/2016 | Kim | |
| 2016/0254694 A1 | 9/2016 | Peterson et al. | |
| 2016/0344195 A1 | 11/2016 | Xu et al. | |
| 2016/0372948 A1 | 12/2016 | Kvols | |
| 2017/0063142 A1 | 3/2017 | Loewen | |

OTHER PUBLICATIONS

"Dell Mobile Computing Cart-Managed (with Docking) Docking solution for Dell Latitude 3340," Dell Quick Reference Guide, Mar. 2014, pp. 1-10, http://www.ergotron.com/Dell.

"Dell Mobile Computing Cart," Dell Quick Reference Guide for Models ERGITD-001 and ERGITD-002 Rev. B, Oct. 2013, pp. 1-13, http://www.ergotron.com/Dell.

Pierce, David, "Lenovo Yoga Tablet review", Nov. 12, 2013, pp. 1-8, https://www.theverge.com/2013/11/12/5090560/lenovo-yoga-tablet-8-10-review.

* cited by examiner

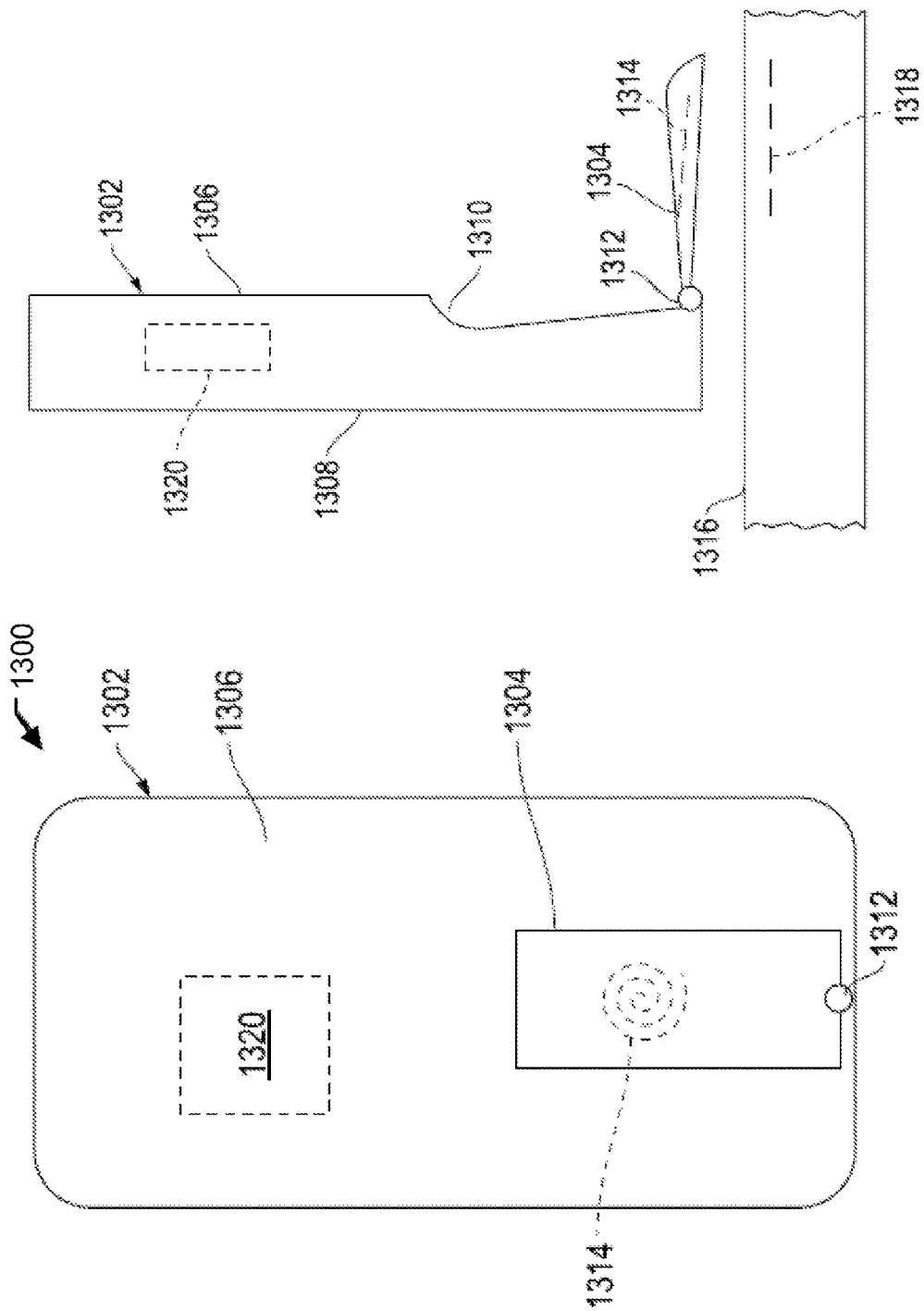

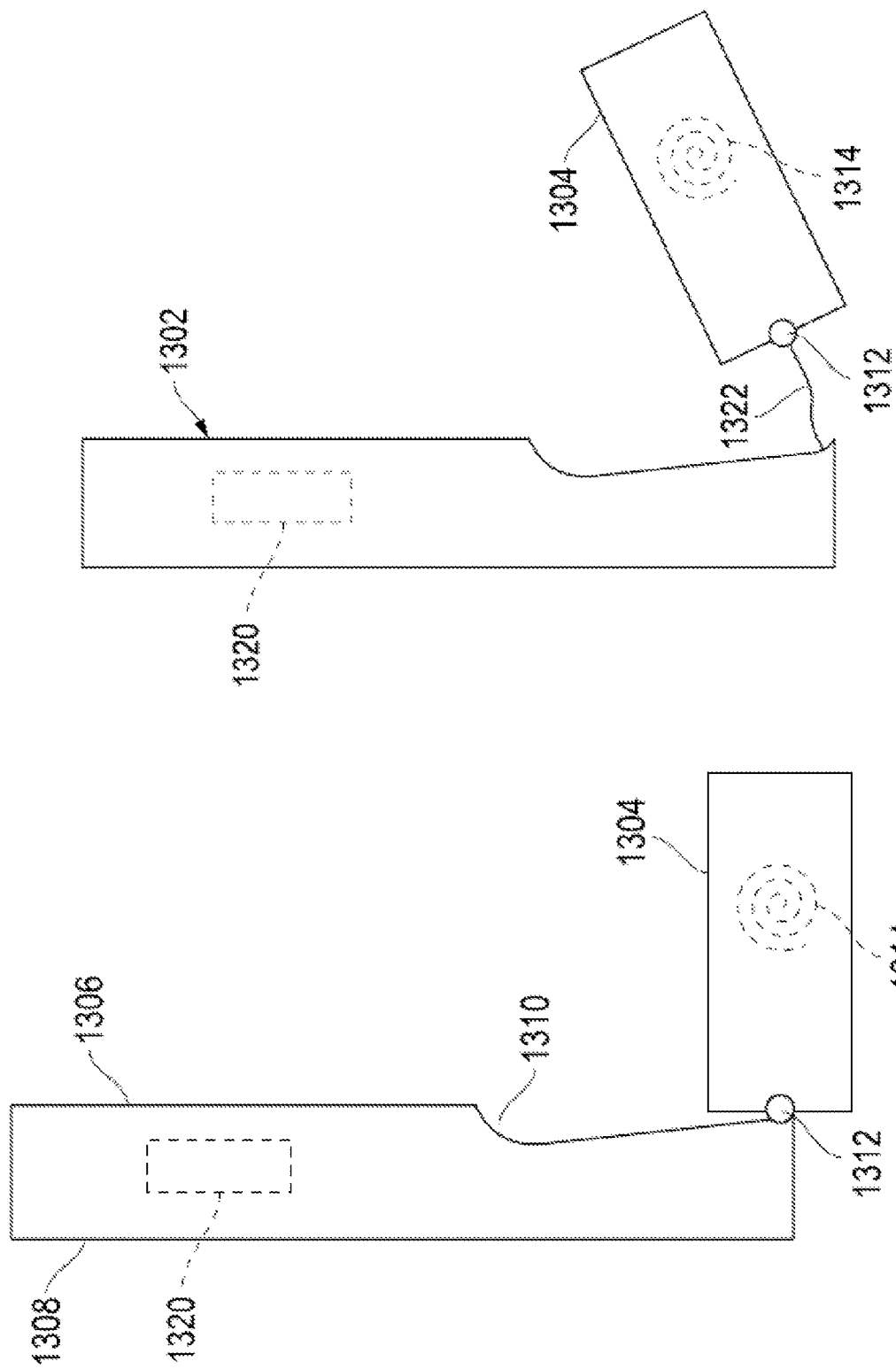

WIRELESS POWER TRANSMISSION ANTENNA WITH THERMALLY CONDUCTIVE MAGNETIC SHIELD AND METHOD THEREFOR

CROSS REFERENCE TO RELATED APPLICATIONS

Related subject matter is contained in co-pending U.S. patent application Ser. No. 14/842,553, entitled "Wireless Power Antenna Winding Including Heat Pipe and Method Therefor," filed on Sep. 1, 2015, the disclosure of which is hereby incorporated by reference.

Related subject matter is contained in co-pending U.S. patent application Ser. No. 14/842,783, entitled "Wireless Charging Pad with Natural Draft Cooling and Method Therefor,", filed on Sep. 1, 2015, the disclosure of which is hereby incorporated by reference.

Related subject matter is contained in co-pending U.S. patent application Ser. No. 14/842,788, entitled "Wireless Charging Pad with Interdependent Temperature Control and Method Therefor," filed on Sep. 1, 2015, the disclosure of which is hereby incorporated by reference.

Related subject matter is contained in co-pending U.S. patent application Ser. No. 14/842,792, entitled "Cart for Wirelessly Recharging Mobile Computing Devices,", filed on Sep. 1, 2015, the disclosure of which is hereby incorporated by reference.

Related subject matter is contained in co-pending U.S. patent application Ser. No. 14/842,794, entitled "Cover System for Wireless Power Pad,", filed on Sep. 1, 2015, the disclosure of which is hereby incorporated by reference.

Related subject matter is contained in co-pending U.S. patent application Ser. No. 14/842,795, entitled "Peak Power Caching in a Wireless Power System,", filed on Sep. 1, 2015, the disclosure of which is hereby incorporated by reference.

Related subject matter is contained in co-pending U.S. patent application Ser. No. 14/842,797, entitled "Wireless Power Charging Device with Rear Side Magneto Isolation Marking,", filed on Sep. 1, 2015, the disclosure of which is hereby incorporated by reference.

Related subject matter is contained in co-pending U.S. patent application Ser. No. 14/842,798, entitled "Articulating Receiver for Wireless Power Delivery System,", filed on Sep. 1, 2015, the disclosure of which is hereby incorporated by reference.

Related subject matter is contained in co-pending U.S. patent application Ser. No. 14/842,800, entitled "System for Securing a Wireless Power Pad,", filed on Sep. 1, 2015, the disclosure of which is hereby incorporated by reference.

FIELD OF THE DISCLOSURE

The present disclosure generally relates to information handling systems, and more particularly relates to wireless power for information handling systems.

FIELD OF THE DISCLOSURE

The present disclosure generally relates to information handling systems, and more particularly relates to wireless power for information handling systems.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

A wireless power delivery system typically includes a wireless charging pad on to which a device can be placed for charging. The device can communicate with the pad via near field communication (NFC) to indicate that the device is available to receive power. The wireless power delivery system can then wirelessly transmit power to the device.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 13a is a front view of the back side of a mobile computing device, according to an embodiment of the disclosure;

FIG. 13b is a side view of the mobile computing device with a wireless power receiver deployed to a first position;

FIG. 13c is another side view of the mobile computing device with the wireless power receiver deployed to a second position;

FIG. 13d is another side view of the mobile computing device with the wireless power receiver deployed to a third position;

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
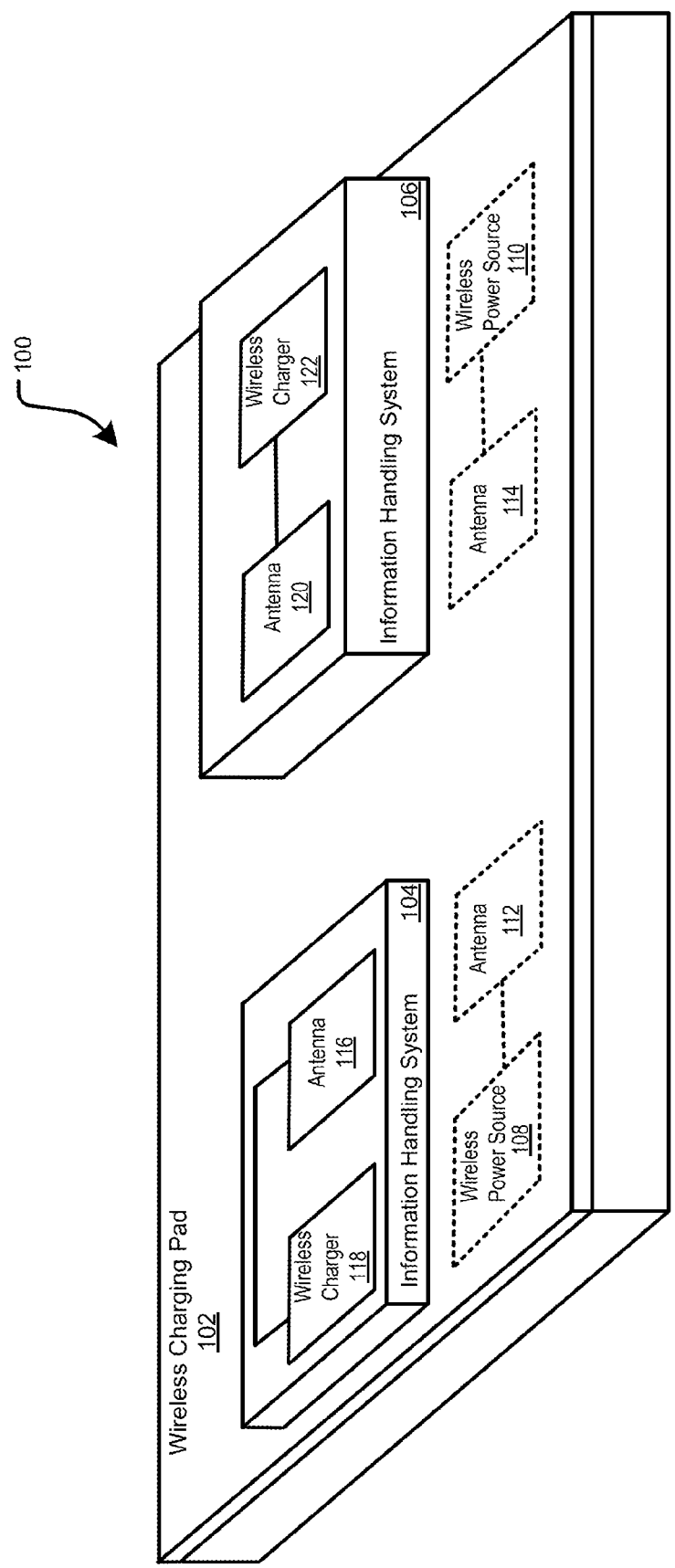
FIG. 1 is a block diagram of a wireless power delivery system according to an embodiment of the present disclosure.

FIG. 1 shows a wireless power delivery system 100 that includes a wireless charging pad 102 for information handling systems 104 and 106. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The wireless charging pad 102 includes wireless power sources 108 and 110, and antennas 112 and 114. The information handling system 104 includes an antenna 116 and a wireless charger 118. The information handling system 106 includes an antenna 120 and a wireless charger 122. The wireless power source 108 is in communication with the antenna 116, which in turn is in communication with the antenna 116 of the information handling system 104 and with the antenna 120 of the information handling system 106. The antenna 116 is in communication with the wireless charger 118. The antenna 120 is in communication with the wireless charger 122.

The wireless charging pad 102 can detect when a device such as one of the information handling systems 104 and 106 is placed on top of the wireless charging pad, and can transmit a detect signal in response to detecting the device. For example, the wireless charging pad 102 can detect the information handling system 104 when a light sensor on the wireless charging pad 102 is covered by the information handling system, by a pressure sensor of the wireless charging pad detecting the information handling system, by metal tabs of the wireless charging pad being placed in physical communication with the information handling system, and the like. The information handling system 104 can receive the detect signal from the wireless charging pad, and can respond by transmitting a presence signal to the wireless charging pad. The presence signal can include a repeating pulse signal, referred to as a chirp, and can also include information associated with the information handling system 104, such as a class of the information handling system. The class of the information handling system 104 can indicate a maximum power needed for the information handling system, or the like.

The wireless charging pad 102 can receive the presence signal from the information handling system 104, and can then set an initial power level to be provided from the wireless power source 108 to the information handling system. The initial power level can be a minimum power level available from the wireless charging pad 102, can be a maximum power level available from the wireless charging pad, or can be any power level in between the minimum and maximum power levels. The wireless charging pad 102 can then transmit the wireless power to the information handling system 104 via the antenna 112. The wireless charging pad 102 can use one or more techniques to provide power wirelessly, including inductive techniques, resonant inductive techniques, capacitive transfer techniques, beamed power transfer such as laser or microwave transfer, or the like. However for purposes of discussion, it is assumed that the wireless charging pad 102 transfers power wirelessly using inductive power transfer. The antenna 116 of the information handling system 104 can receive the wireless power from the antenna 112 and can provide the power to the wireless charger 118, which in turn can convert the power to be used by the information handling system 104.

The information handling system 104 can monitor its current operating conditions and can determine whether to change a power state of the information handling system. For example, if the information handling system 104 is receiving the maximum amount of power from the wireless charging pad 102 and then the information handling system enters a lower power mode, the information handling system can send a power state change signal to the wireless charging pad 102. The power state change can indicate a new power state for the information handling system 104. The wireless charging pad 102 can receive the power state change signal and can adjust the power level provided by the wireless power source 108 to the information handling system 104, such that a proper power level is provided to the information handling system without having excess power that is not used or not having enough power for the information handling system. The information handling system 104 can continually monitor its operating mode and can provide any necessary state change signals to the wireless charging pad 102.

The information handling system 106 can also receive the detect signal from the wireless charging pad 102 in response to the information handling system being placed on top of the wireless charging pad. The information handling system 106 can respond to the detect signal by transmitting a presence signal similar to the presence signal of the information handling system 104 to the wireless charging pad. The wireless charging pad 102 can receive the presence signal from the information handling system 106, and can then set an initial power level to be provided from the wireless power source 110 to the information handling system. The wireless power can then be transmitted from the wireless charging pad 102 to the information handling system 106 via the antenna 114. The antenna 120 can receive the wireless power from the antenna 114 and can provide the power to the wireless charger 122, which in turn can convert the power to be used by the information handling system 106. The information handling system 106 can monitor its operating modes and can provide any necessary state change signals to the wireless charging pad 102 in a substantially similar fashion as the information handling system 104.

In an embodiment, when the wireless charging pad 102 provides wireless power to both of the information handling systems 104 and 106, the wireless charging pad can provide equal amounts of power to each of the information handling systems, can prioritize which information handling system to provide more power to, or the like. The information handling systems 104 and 106 can receive information indicating an amount of power to be provided to the information handling system from the wireless charging pad 102, and the like. The information handling systems 104 and 106 can utilize this information to determine whether the power available from the wireless charging pad 102 is enough to operate the information handling system at a maximum power operating mode or if the information handling system should operate in a lower operating mode. Each of the information handling systems 104 and 106 can dynamically adjust its operating mode based on the power available from the wireless charging pad 102. Thus, the wireless charging pad 102 and the information handling systems 104 and 106 can continually provide feedback to each other to adjust the amount of power provided from the wireless charging pad to the information handling systems.

Figure 2A:
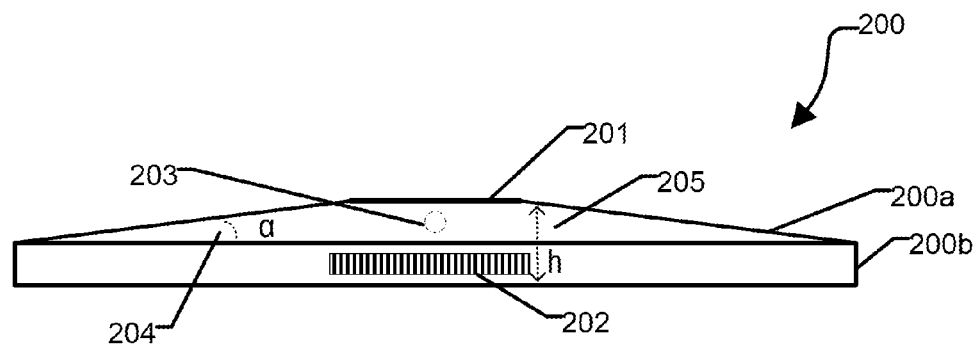
FIG. 2a illustrates a side view of a wireless charging pad utilizing convection cooling according to a specific embodiment of the present disclosure.
Figure 2B:
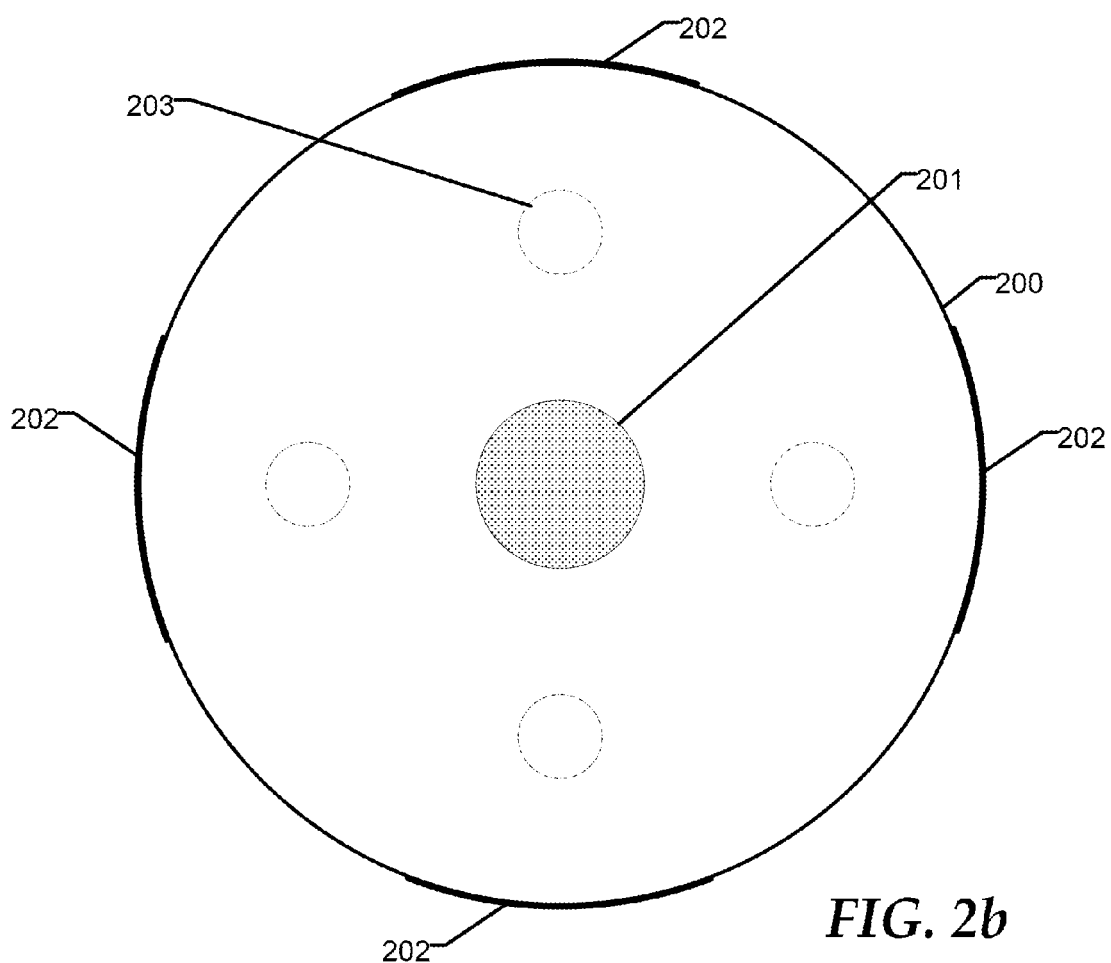
FIG. 2b illustrates a top view of the wireless charging pad of FIG. 2a according to a specific embodiment of the present disclosure.

FIG. 2a illustrates a side view of a wireless charging pad 200 that utilizes convection cooling according to a specific embodiment of the present disclosure. Wireless charging pad 200 includes a top portion 200a and a base portion 200b. Top portion 200a includes an outlet 201 for exhausting heated air, and base portion 200b includes one or more inlets 202 for receiving ambient air. Top portion 200a also includes one or more wireless power antennas 203, attached to an inside surface of top portion 200a. FIG. 2b illustrates a top view of the wireless charging pad 200, also showing placement of outlet vent 201, inlet vents 202, and antennas 203. Top portion 200a and bottom portion 200b form an enclosure having an open cavity within. In addition to antennas 203, the enclosure can include a wireless power controller and other components, not shown in FIGS. 2a and 2b. As shown at FIG. 2b, inlet vents 202 can be distributed around the perimeter of base portion 200b. Furthermore, each of inlets 202 can be positioned relative to a respective antenna 203 to provide a direct path of airflow from a specific inlet 202, passing by a corresponding antenna 203, and exiting at outlet 201. One of skill will appreciate that each inlet vent 202 can be larger than shown. In one embodiment, inlets 202 can be contiguous, forming a single inlet extending along the entire perimeter of pad 200.

A major surface of top portion 200a is inclined relative to base portion 200b, the inclination indicated by reference 204, a. For example, in this particular embodiment, top portion 200a is substantially conical, reaching an apex at outlet 201 at the center of top portion 200a. Inclination angle 204 can be between a couple degrees and approximately ten degrees, and is typically about five degrees. One of skill will appreciate that angle 204 can be greater, for example thirty degrees, because the increased height 205 can result in increased airflow. In another embodiment, angle 204 can be greater than ten degrees. A height of the internal cavity is indicated by reference 205, h. Height h depends on a diameter of base 200b and on angle 204, but can range from 5 millimeters to 20 millimeters or more, and is typically about 5-10 millimeters. In an embodiment, outlet 201 and inlet 202 can be implemented using perforated metal or plastic, such as eighty percent hex-perforated material, wherein the value eighty percent refers to a material having an area that is eighty percent openings and twenty percent non-porous material. The dimensions of outlet 201 can vary based on the total dimensions of pad 200. For example, pad 200 may be approximately two feet in diameter and outlet 201 can be approximately five inches across. One of skill will appreciate that pad 200 may be smaller or larger without departing from the scope of this disclosure.

During operation of wireless charging pad 200, heat is generated by antennas 203. A wireless antenna can generate heat due to resistive losses within the antenna inductor coil, eddy currents induced in conductive materials in the vicinity of magnetic flux generated by the antenna, and eddy currents induced in a magnetic shield that is typically included at an antenna assembly. A wireless charging pad may also be heated by the device being charged. Air in the vicinity of antenna 203 is heated and naturally rises by thermal convection. A thermal gradient between inlet 202 and outlet 201 results in a corresponding air density and pressure differential between the inlet and outlet, causing ambient air to flow into inlet 202 and exhaust from outlet 201. Accordingly, a natural draft is created, pulling ambient air into inlet 202 and exhausting heated air from outlet 201. For example, if the temperature of ambient air at inlet 202 is 23° C. and the temperature of air at the top of the cavity formed by top portion 200a, having been heated by antenna 213, is 55° C., the temperature differential across height 205 is 32° C. Under these circumstances, and for an enclosure having typical dimensions described above, airflow of approximately one cubic foot per minute (1 cfm) can be achieved without utilizing any form of active cooling, such as airflow provided by a fan.

The airflow can be calculated using a conservation of energy equation, such as Bernoulli's equation, along a streamline from a point$_1$ to a point$_2$, $$P_1 + \tfrac{1}{2}\rho_1 V_1^2 + \rho_1 g h_1 = P_2 + \tfrac{1}{2}\rho_2 V_2^2 + \rho_2 g h_2 + \tfrac{1}{2}\rho_f F V_2^2. \quad [1]$$

Figure 2C:
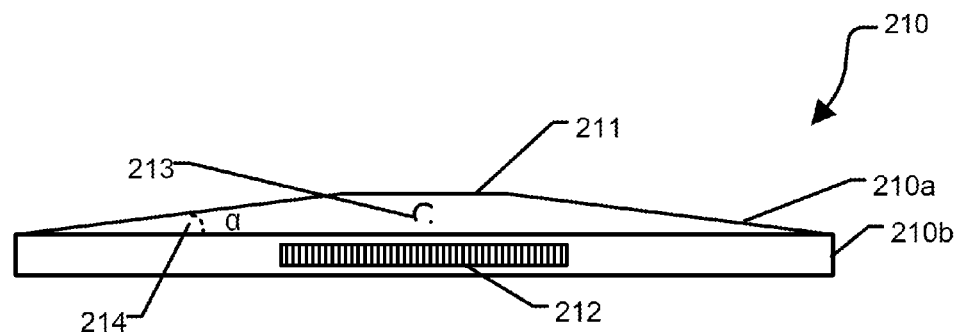
FIG. 2c illustrates a side view of a wireless charging pad utilizing convection cooling according to another specific embodiment of the present disclosure.
Figure 2D:
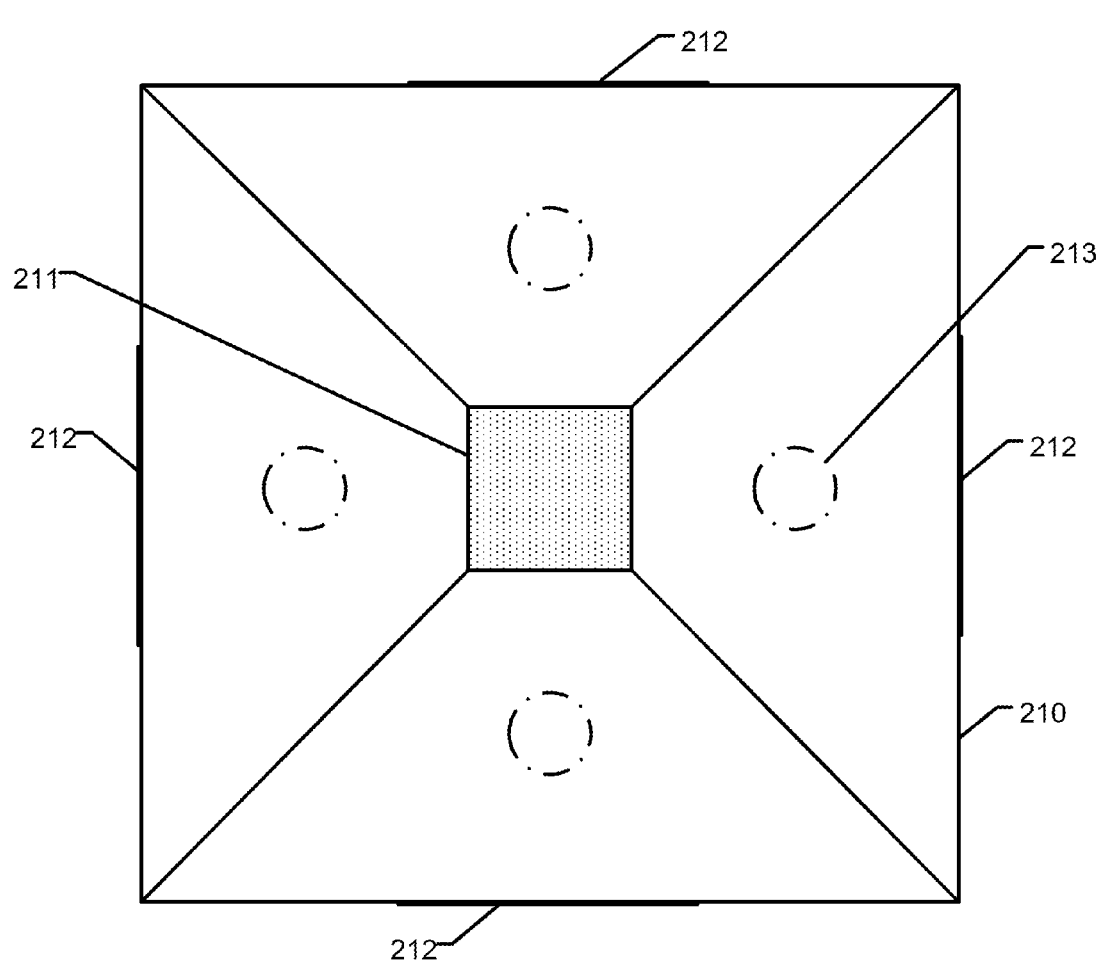
FIG. 2d illustrates a top view of the wireless charging pad of FIG. 2c according to a specific embodiment of the present disclosure.

Where: P1 is the internal energy (static pressure),
$\tfrac{1}{2}\rho V^2$ is kinetic energy (dynamic pressure),
$\rho g h$ is potential energy (potential pressure), and
$\tfrac{1}{2}\rho F V^2$ is frictional energy losses due to the perforated inlet/outlets;

FIG. 2c illustrates a side view of a wireless charging pad 210 utilizing convection cooling according to another specific embodiment of the present disclosure. Charging pad 210 is similar to pad 200 of FIGS. 2a and 2b, however the footprint of the enclosure is rectangular instead of circular. Accordingly, the top surface is pyramidal instead of conical. Pad 210 includes a top portion 210a and a base portion 210b. A major surface of top portion 210a is inclined relative to base portion 210b, the inclination indicated by reference 214, α. Top portion 210a includes an outlet 211 for exhausting heated air, and base portion 210b includes one or more inlets 212 for receiving ambient air. Top portion 210a also includes one or more wireless power antennas 213, attached to an inside surface of top portion 210a. FIG. 2d illustrates a top view of the wireless charging pad 210, also showing placement of outlet vent 211, inlet vents 212, and antennas 213. Top portion 210a and bottom portion 210b form an enclosure having an open cavity within. Operation of pad 210 is the same as described above with reference to pad 200. In another embodiment, not shown, a charging pad may be triangular, hexagonal, or another shape. Any pad implementation that includes an internal cavity having elevation between an air inlet vent and an exhaust vent, and a wireless charging antenna positioned approximately inline and between the inlet vent and exhaust vent will provide the passive cooling effect disclosed herein.

Figure 2E:
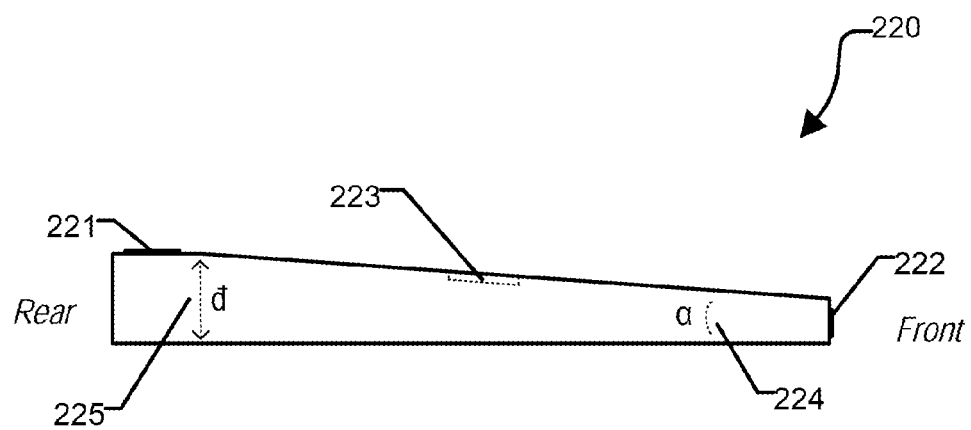
FIG. 2e illustrates a side view of a wireless charging pad utilizing convection cooling according to still another specific embodiment of the present disclosure.

FIG. 2e illustrates a side view of a wireless charging pad 220 utilizing convection cooling according to still another specific embodiment of the present disclosure. Charging pad 220 is also rectangular and includes an inclined top surface, however an outlet vent 221, and the enclosure apex, is located at the rear of the pad. Pad 220 includes an inlet 222 for receiving ambient air, and at least one antenna 223 located between and inline with inlet 222 and outlet 221. Inclination of the pad top surface is indicated by reference 224, a. The internal cavity of pad 220 reaches a maximum height at the rear of the pad and proximate to outlet 221, indicated by reference 224, h.

Figure 2F:
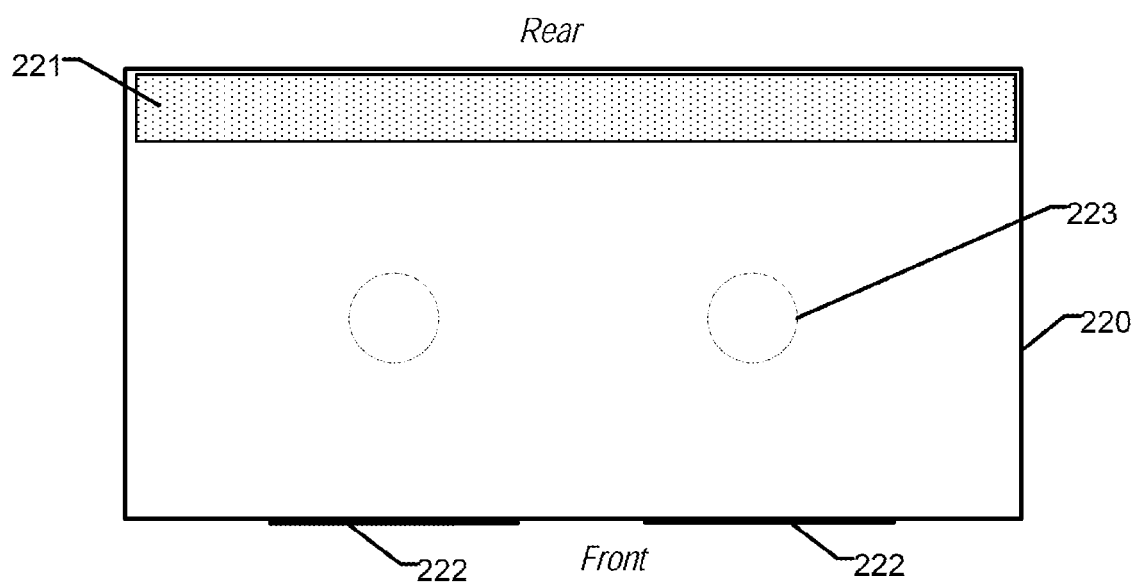
FIG. 2f illustrates a top view of the wireless charging pad of FIG. 2e according to a specific embodiment of the present disclosure.

FIG. 2f illustrates a top view of the wireless charging pad 220 of FIG. 2e. Pad 220 includes two antennas 223, two inlet vents 222, and a single outlet vent 221 spanning approximately the entire width of pad 220. Pad 220 can include only one antenna 223 or can include more than two antennas. For example, three antennas 223 can be arranged across the width of pad 220 and a corresponding inlets 222 can be positioned along the front edge so that air flows in a line between each inlet 222 and a respective antenna 223, continuing in a laminar fashion to exhaust outlet 221. In another embodiment, pad 220 can include more than one exhaust outlet 221. For example, each antenna 223 can have a corresponding inlet 222 and outlet 221. In still another embodiment, pad 220 can include multiple antennas 223, one outlet 221 as shown in FIG. 2f, and a single inlet 222 spanning approximately the entire width of pad 220, similar to outlet 221.

Figure 2G:
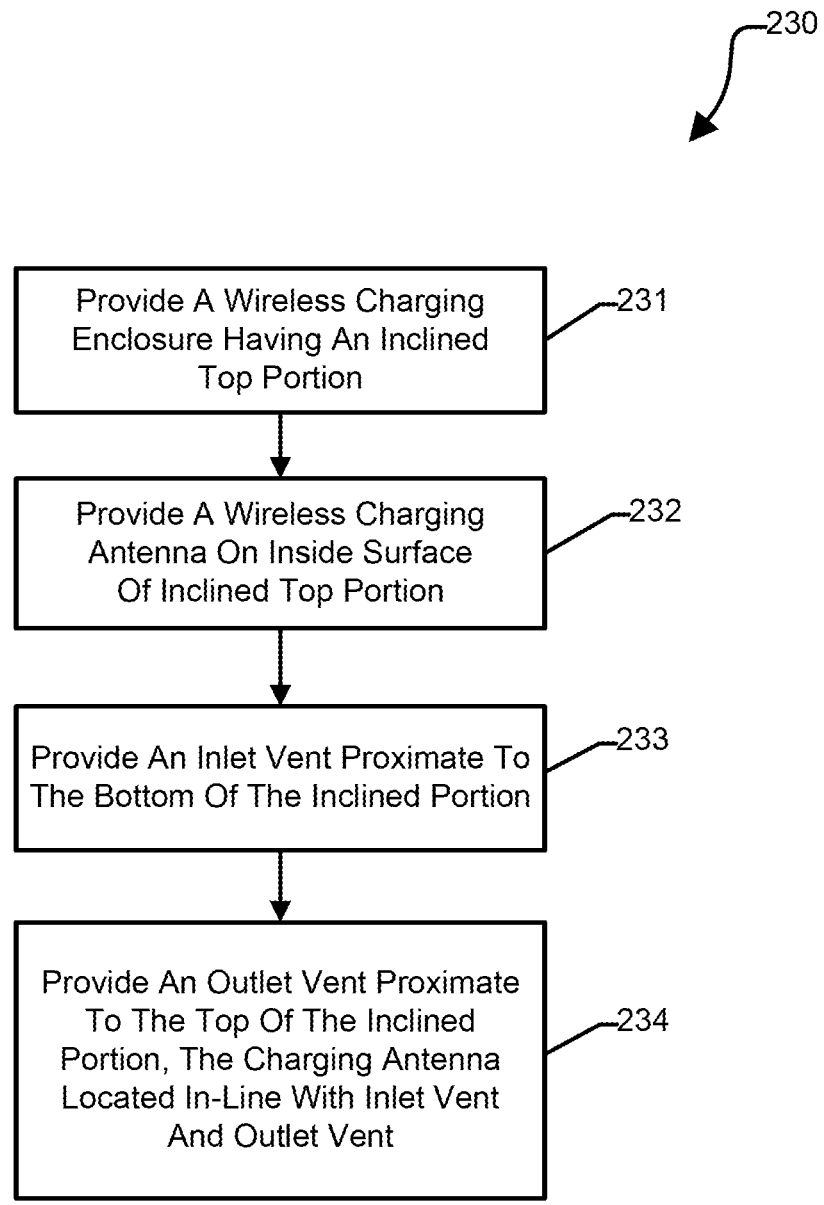
FIG. 2g is a flow diagram illustrating a method for providing passive cooling at a wireless charging pad according to a specific embodiment of the present disclosure.

FIG. 2g is a flow diagram illustrating a method 230 for providing passive cooling at a wireless charging pad according to a specific embodiment of the present disclosure. Method 230 begins at block 231 where an enclosure having an inclined top portion is provided. For example, top portion 200a of pad 200 is inclined at an angle 204. The method continues at block 232 where a wireless charging antenna, such as antenna 203, is provided on an inside surface of the inclined top portion. AT block 233, an inlet vent is provided at then enclosure, the inlet vent proximate to a bottom of the inclined portion, such as at base portion 200b. The method completes at block 234 where an outlet vent is provided proximate to the top of the inclined top portion. The charging antenna is located in-line with the inlet vent and the outlet vent, as shown at FIGS. 2b, 2d, and 2f. During operation, air within the enclosure is heated by a wireless charging antenna. The air rises to the top of the enclosure, creating a pressure differential between the inlet vent and the exhaust vent, which causes ambient air to flow into the inlet vent and exit at the exhaust vent. The natural draft is maintained without the use of fans or other active cooling components.

Figure 3A:
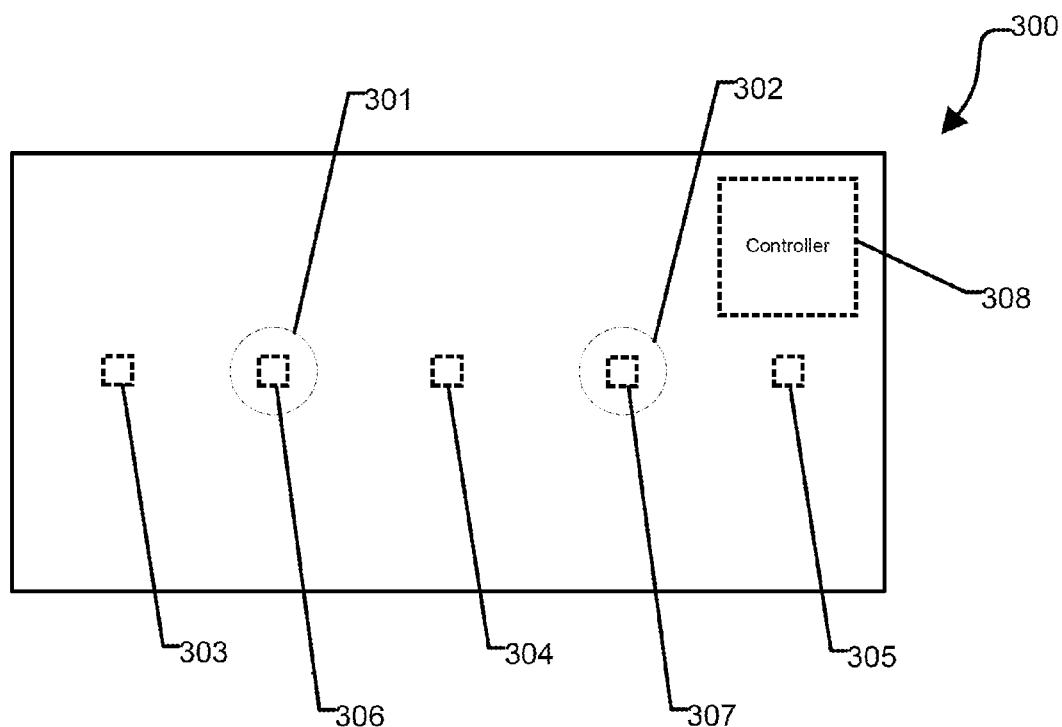
FIG. 3a illustrates a top view of a wireless charging mat having thermal control according to a specific embodiment of the present disclosure.

FIG. 3a illustrates a top view of a wireless charging pad 300 having thermal control according to a specific embodiment of the present disclosure. Charging pad may be similar to pads depicted at FIGS. 2a-2f, or may be of any other configuration, such as a thin flat enclosure having a plastic surface. Pad 300 includes a charging antenna 301 and another charging antenna 302. Antennas 301 and 302 can be located on an under-surface of pad 300, molded inside the surface of mat 300, visible and planar to the top surface, or at another position that facilitates placement of a data processing device to receive wireless power within a suitable range of a corresponding antenna. Pad 300 further includes a distal temperature sensor 303 and a wireless power controller 308. Pad 300 may optionally include a distal temperature sensor 304 and a distal temperature sensor 305. Pad 300 may optionally include a proximal temperature sensor 306, and a proximal temperature sensor 307.

As used herein, the term distal is intended to describe a temperature sensor that is not integrated with an antenna or proximate to an antenna. For example, distal antenna 304 is located approximately midway between antenna 301 and antenna 302. Distal temperature sensors 303 and 305 are not immediately proximate to an antenna. As used herein, the term proximal is intended to describe a temperature sensor that is in close proximity to an individual antenna, for example immediately adjacent to the antenna coil, integrated with an antenna assembly, and the like. An antenna assembly, such as antennas 301 and 302, includes an inductor, which typically includes multiple turns of wire arranged in a spiral or a solenoid configuration. The antenna assembly can also include a magnetic shield (not shown) that controls the shape of a magnetic flux field present at the antenna. The magnetic shield can reduce energy loss resulting from the magnetic flux interacting with conductive material in the vicinity of the antenna.

By locating distal temperature sensor 304 approximately midway between antenna 301 and antenna 302, distal sensor 304 is responsive to heat generated by both antenna 301 and antenna 302, as well as heat generated by a device receiving power from antenna 301 and a device receiving power from antenna 302.

Figure 3B:
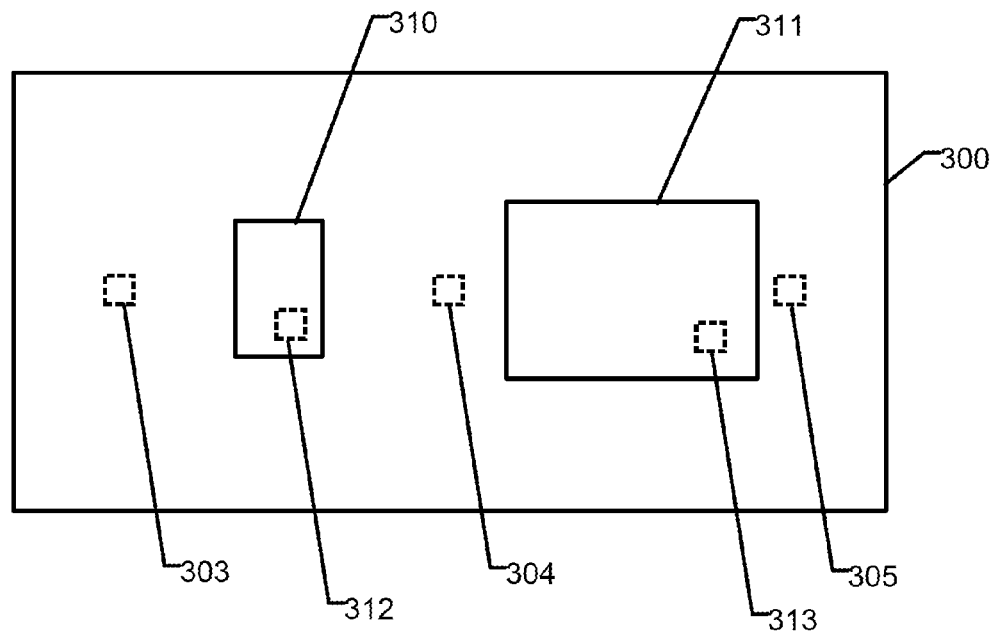
FIG. 3b illustrates the wireless charging mat of FIG. 3a including devices receiving wireless power according to a specific embodiment of the present disclosure.

FIG. 3b illustrates the wireless charging pad of FIG. 3a including devices receiving wireless power according to a specific embodiment of the present disclosure. At FIG. 3b, a data processing device 310 is placed on the surface of pad 300 approximately over antenna 301, and another data processing device 311 is placed on the surface of pad 300 approximately over antenna 302. Device 310 can include a remote temperature sensor 312, and device 311 can include a remote temperature sensor 313. As used herein, the term remote is intended to describe an antenna that is not included at a wireless charging pad, but is instead located within a device that is receiving power from the charging pad. Wireless power controller 308 can receive temperature information from the remote temperature sensors using a remote communication system such as Bluetooth, backscatter modulation of a reflected impedance of the receiver device, or another wireless data communications technique. Accordingly, in one embodiment, pad 300 can interdependently regulate charging power at antenna 301 and at antenna 302 based on temperature information provided by a combination of distal, proximate, and remote temperature sensors.

In addition, controller 308 can receive operating specifications from data processing devices that are receiving power from pad 300. For example, data processing device 310 that is being charged by pad 300 may specify that a skin temperature of the device not exceed 43° C. The skin temperature of device 310 can be based on heat generated the device itself, including energy losses at a wireless power receiving antenna included at the device, heat generated at a battery at device 310 that is being charged, and heat generated by circuitry included at device 310.

The skin temperature of device 310 can also depend on heat generated by antenna 301 that is providing power to device 310, and heat generated at another charging antenna and device. For example, if data processing device 311 is receiving power from pad 300 at the same time that device 310 is receiving power; heat that is associated with the charging of device 311 can propagate through pad 300 and increase the skin temperature of device 310. This can be especially problematic if device 310 is small and delicate, such as a mobile phone device, while device 311 is large and requires significant power, such as a notebook computer device, and the like. Continuing this example, controller 308 can determine that the skin temperature of device 310 is about to exceed 43° C. Based on temperature information received at controller 308 from distal temperature sensors 304 and/or 305, and optionally temperature information received from other proximal and remote temperatures sensors, controller 308 can determine that a significant source of the heat at device 310 is the result of supplying power to device 311. Accordingly, Controller 308 can elect to decrease an amount of power supplied to device 311 until the skin temperature at device 310 is sufficiently reduced.

Figure 3C:
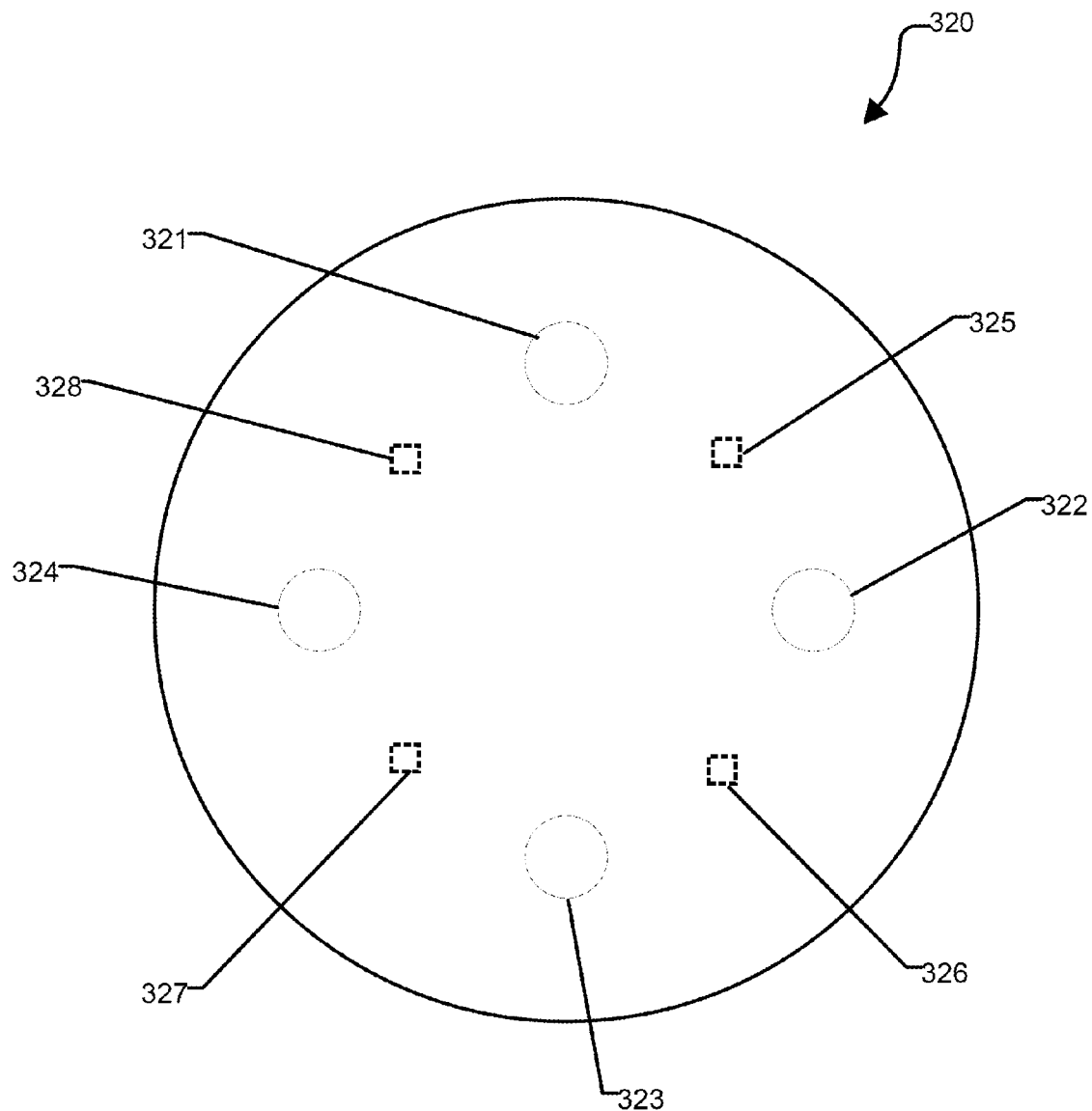
FIG. 3c illustrates a top view of a wireless charging pad having thermal control according to another embodiment of the present disclosure.

FIG. 3c illustrates a top view of a wireless charging pad 320 having thermal control according to another embodiment of the present disclosure. Wireless charging pad 320 includes four charging antennas: antenna 321, antenna 322, antenna 323, and antenna 324. Pad 320 also includes four distal temperature sensors: sensor 325, sensor 326, sensor 327, and sensor 328. Pad 320 can also include proximal temperature sensors located at respective antennas (not shown at FIG. 3c). Different from pad 300, each of distal temperature sensors 325-328 are located approximately midway between adjacent antennas. Operation of pad 320 is similar to that described above with reference to pad 300, wherein temperature information provided by distal sensors 325-328 allow a wireless charging controller (not shown) to determine how each antenna and associated data processing device that is receiving power from pad 320 is contributing heat to various regions and devices presently being charged. Based on this information, the controller can regulate a power transfer rate at each device. While wireless charging pad 320 is shown as being circular in shape, one of skill will appreciate that similar placement of distal temperature sensors can be achieved at a pad having two or more antennas that is rectangular, hexagonal, or another shape. For example, a rectangular charging pad can include three antennas arranged in a row, with a distal antenna located between each pair of adjacent antennas.

Figure 3D:
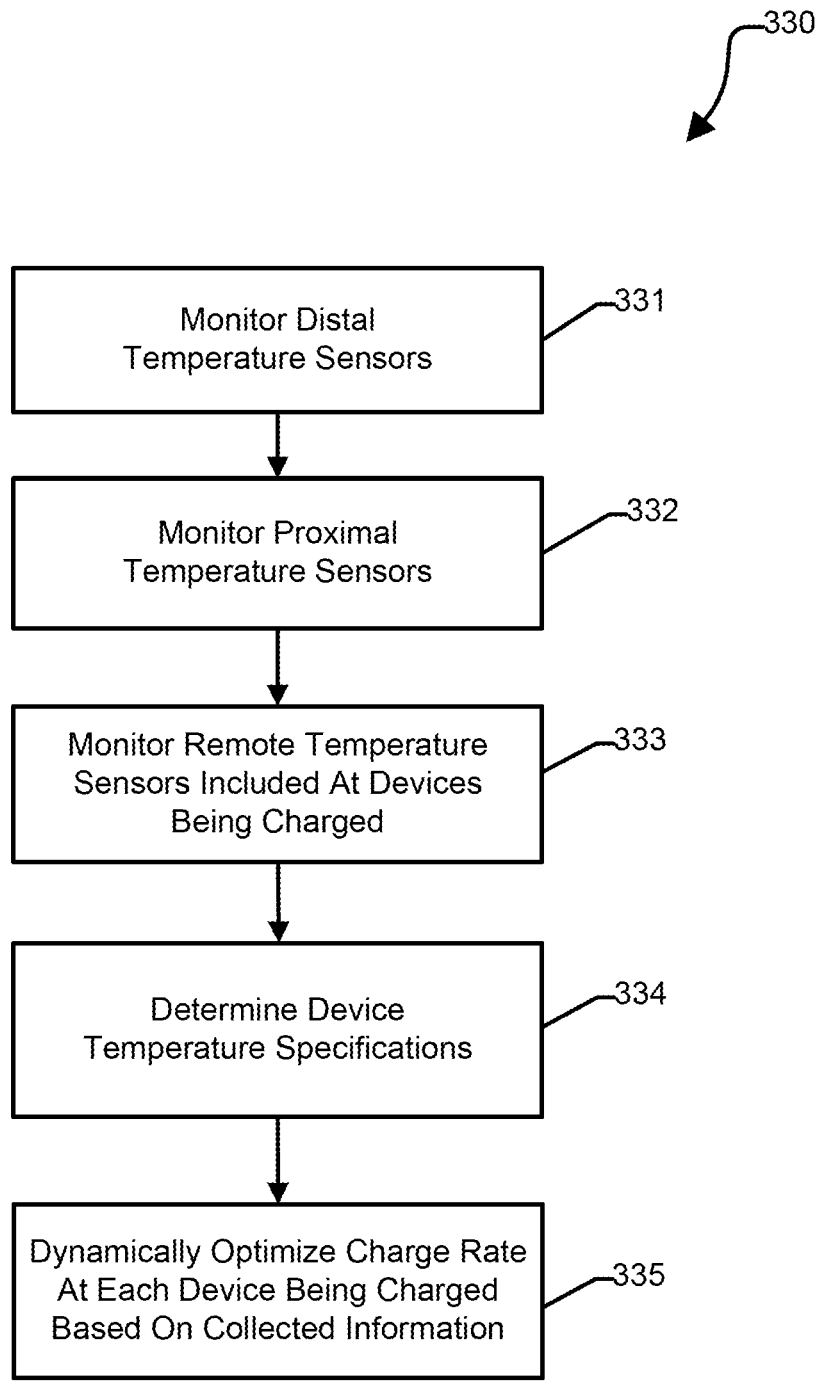
FIG. 3d is a flow diagram illustrating a method for controlling wireless charging according to a specific embodiment of the present disclosure.

FIG. 3d is a flow diagram illustrating a method 330 for controlling wireless charging according to a specific embodiment of the present disclosure. The method begins at block 331 where a wireless charging pad controller monitors distal temperature sensors. For example, controller 308 can monitor distal temperature sensors 303, 304, and 305 of FIG.

3*a*. The method continues at block 332 where the controller can monitor temperature sensors included at wireless power antennas, for example proximal temperature sensors 306 and 307. The method proceeds to block 333 where the controller can monitor temperature sensors included at devices that are being charged, for example data processing devices 310 and 311 of FIG. 3*b*. The method continues at block 334 where the controller can determine temperature specification information from devices being charged. For example, controller 308 can request maximum skin temperature information from devices 310 and 311 using a wireless communication system.

The method completes at block 335 where the wireless power controller can dynamically optimize a charge rate at each device that is being charged based on the collected information. For example, wireless power controller 308 can determine that temperature readings received from distal temperature sensor 305, and optionally from distal sensor 303 and 304, proximal sensors 306 and 307, and remote sensors 312 and 313, indicate that significant heating at device 310 is due to the charging of device 311. Controller 308 may further determine that heating at device 310 may soon exceed a maximum skin temperature specification of device 310. Accordingly, controller 308 can elect to reduce a power transfer to device 311, thereby reducing heat generated at and near device 311.

Figure 4A:
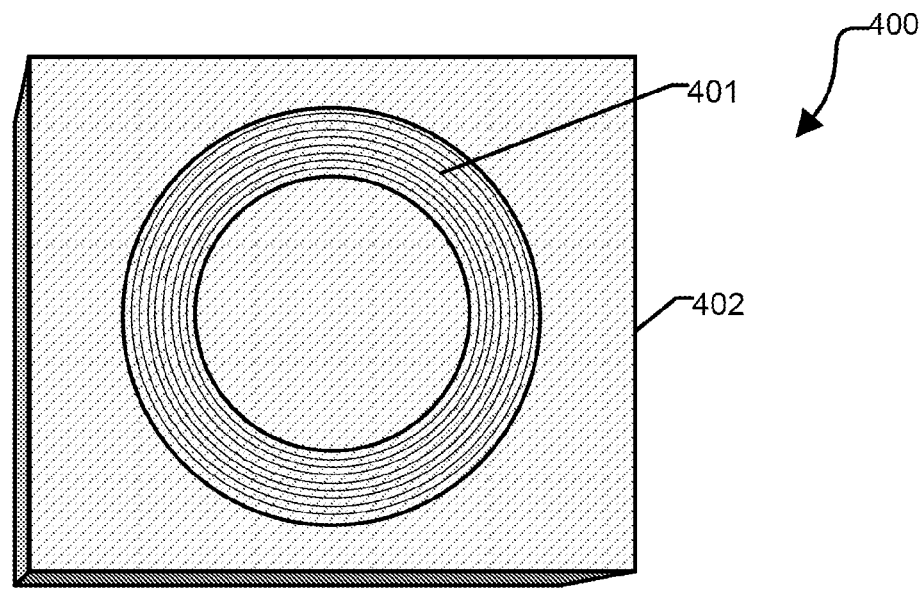
FIG. 4a illustrates a top view of a wireless power antenna assembly according to a specific embodiment of the present disclosure.

FIG. 4*a* illustrates a top view of a wireless power antenna assembly 400 according to a specific embodiment of the present disclosure. Antenna assembly 400, which can be simply referred to as an antenna, includes an inductor 401 and a magnetic shield 402. Antenna assembly 400 can be a transmitting antenna, which may be referred to as a source antenna, or assembly 400 can be a receiving antenna, which may be referred to as a target antenna. Inductor 401 is typically a coil of wire. As disclosed herein, magnetic shield 402 includes carbon nanotubes or another carbon or graphite material to increase a thermal conductivity of the magnetic shield.

During operation, inductor 401 of a power transmitting antenna is energized by a high frequency signal, which generates a magnetic field around inductor 401. When an inductor of a receiving antenna is placed within this magnetic field, a current is induced in the receiving coil, and it is this current that can be used to provide power to a data processing device coupled to the receiving coil. There are numerous wireless power standards, having operating frequencies ranging from approximately one hundred kilohertz to greater than six megahertz. Antenna assembly 400, and magnetic shield 402 in particular, can be made compliant with any wireless power standard.

Magnetic shield 402 can be implemented to reduce interference caused by a magnetic field generated by antenna 400 or in the vicinity of antenna 400, but is also designed to manipulate a shape of a magnetic flux field generated by a wireless power transmitting antenna. A magnetic shield, such as magnetic shield 402, is typically included at both a transmitting antenna and at a receiving antenna. In particular, magnetic shield 402 is included at a rear surface of a transmitting and at a rear surface of a receiving inductor, such that when a data processing device is placed on a wireless charging pad, the transmitting antenna and the receiving antenna are sandwiched between the magnetic shields. This arrangement causes the magnetic flux lines to be concentrated between the magnetic shields, thereby increasing flux density at the receiving coil and increasing power transfer efficiency. Furthermore, power transfer efficiency is decreased and undesirable heating can occur if the magnetic flux field intersects conductive material, such as metal parts included in the device being charged. Accordingly, magnetic shield 402 reduces an amount of magnetic flux that interacts with other portions of a charging pad or a device being charged.

Magnetic shield 402 includes magnetic materials, such as ferrites, which can influence magnetic fields in its environment. Materials such as ferrite have a greater permeability to magnetic fields than the air around them and therefore concentrate the magnetic field lines around the transmitting and the receiving antenna inductors 401.

Figure 4B:
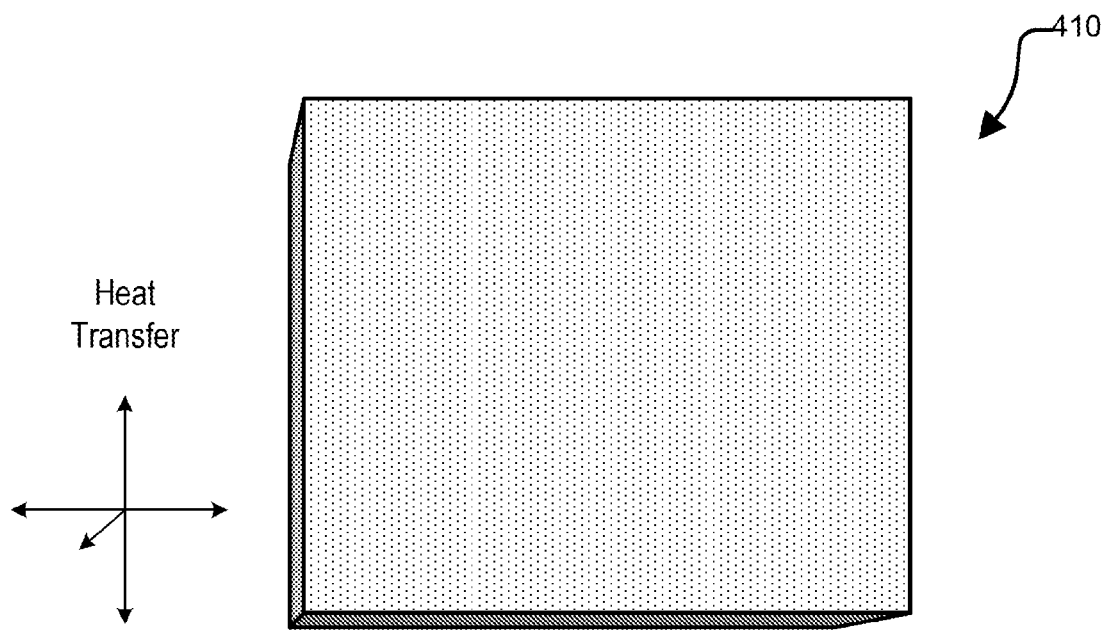
FIG. 4b illustrates a thermally conductive magnetic shield according to specific embodiment of the present disclosure.

FIG. 4*b* illustrates a thermally conductive magnetic shield 410 according to specific embodiment of the present disclosure. Magnetic shield 410 includes a single layer of material that includes both magnetic material and carbon material. The carbon material can be carbon nanotubes, graphene, another type of carbon or graphite fiber or powder, and the like. In one embodiment, the carbon material can be chopped into small pieces and mixed with ferrite material. The mixture can be included in a polymer matrix to provide a substantially amorphous material. For example, magnetic shield 410 can include a loading of twenty percent by volume of chopped carbon nanotubes, or a greater or lesser density of carbon. The amount of carbon to include in the mixture can vary based on a degree of thermal conductivity and magnetic shielding that is desired.

In another embodiment, longer segments or strands of carbon nanotubes can be placed in a polymer matrix including ferrite material. Carbon nanotubes can provide significantly orthotropic heat transfer characteristics, wherein heat is conducted along a length of the nanotube at a greater rate than perpendicular to long dimension of the nanotubes. For example, the nanotubes can be arranged substantially parallel to a major surface of magnetic shield 410, which can cause heat to be predominately conducted towards edges of shield 410. Alternatively, the nanotubes can be arranged to preferentially provide heat conduction perpendicular to the major surfaces of shield. In still another embodiment, nanotube or another carbon material can be arranged within shield 410 to provide substantially omnidirectional heat transfer, such as both parallel and perpendicular to the major surfaces of shield 410.

Figure 4C:
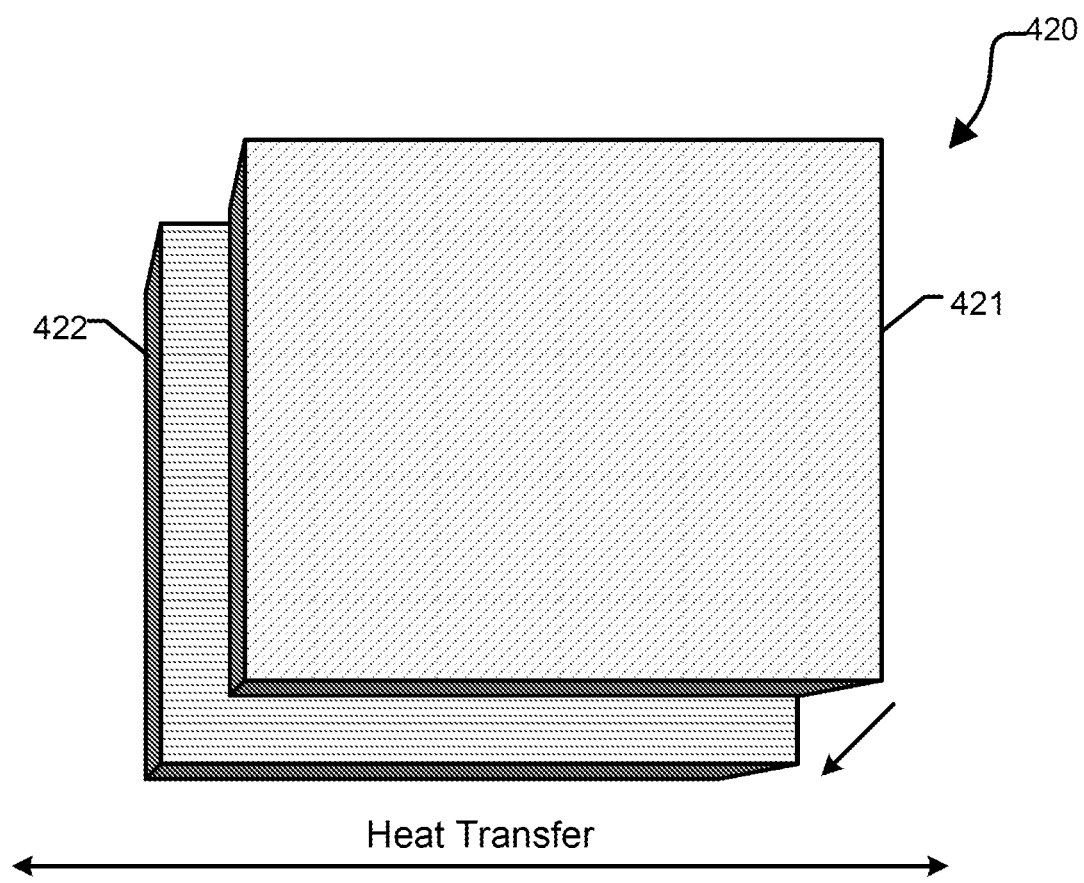
FIG. 4c illustrates a thermally conductive magnetic shield according to another embodiment of the present disclosure.

FIG. 4*c* illustrates a thermally conductive magnetic shield 420 according to another embodiment of the present disclosure. Magnetic shield includes a first layer 421 that is adjacent to a second layer 422. First layer 421 can be adjacent to inductor 401 and include magnetic material to provide desired magnetic shielding characteristics. Second layer 422 can include carbon material, such as carbon nanotube, graphene, or another graphite material. In one embodiment, layer 421 and be laminated to layer 422 using an adhesive, using heating or pressing, or by another method. Both of layers 421 and 422 can include a polymer binder to which carbon, magnetic material, or both carbon and magnetic material can be added. In another embodiment, magnetic layer 421 can include a sintered ferrite sheet, such as pre-cracked ferrite plates. Magnetic layer 421 and carbon layer 422 can further include two or more laminated layers. In still another embodiment, carbon layer 422 can be a paint-like material that is sprayed or brushed onto magnetic layer 421, which then is dried or cured.

As described above, carbon nanotubes, graphite, or another carbon material can be arranged at layer 422 to provide a desired thermal conductivity characteristic. For example, nanotubes included at layer 422 can be arrange with their long axis parallel with the major surfaces of layer 422, thereby accentuating thermal conduction towards the edges of layer 422. The nanotubes can be laid substantially parallel to each other, or can be arranged orthogonally or diagonally relative to each other to promote heat transfer in two or more directions parallel with the major surface of shield 420. Alternatively, carbon can be arranged at layer 422 to promote heat transfer perpendicular to the major surfaces, including away from inductor 401. Layer 422 can be attached to a chassis that acts as a heat sink to dissipate heat conducted away from the inductor surface of antenna assembly 400 by layer 422. For example, layer 422 can attached to, and benefit from, a heat sink or thermal dissipation solution provided by the data processing device that is receiving power via antenna assembly 400.

Figure 5A:
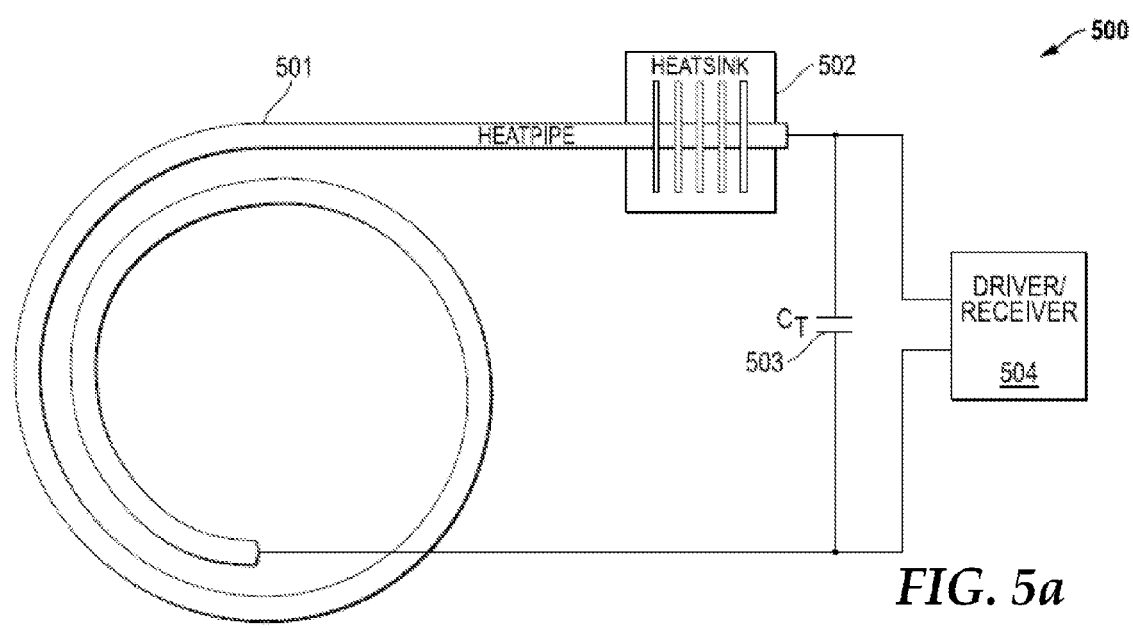
FIG. 5a is a block diagram illustrating a wireless power system including an antenna utilizing a heat pipe according to a specific embodiment of the present disclosure.

FIG. 5a is a block diagram illustrating a wireless power system 500 including an antenna utilizing a heat pipe according to a specific embodiment of the present disclosure. System 500 includes an inductor implemented using a heat pipe 501, a heat sink 502, a tank capacitor 503, and a wireless power driver/receiver 504. System 500 can be a wireless power transmitter that is providing wireless power, or a wireless power receiver included at a data processing device that is receiving power from a wireless power transmission device. The inductor and tank capacitor together provide a resonant tank circuit. One of skill will appreciate that system 500 illustrates a simple inductor-capacitor (LC) tank circuit, and that a wireless power transmitter or receiver can utilize another circuit topology without departing from the scope of the present disclosure.

Wireless power system 500, and the inductor formed by heat pipe 501 in particular, can be implemented to operate at a desired frequency. The operating frequency is based on a number of turns of the inductor coil, the value of tank capacitor 503, and other circuit parameters. For example, wireless power system 500 can be configured to operate according to an inductive wireless power standard having a frequency of approximately one hundred kilohertz, according to resonant wireless power standards having a frequency greater than one megahertz, or according to another wireless power standard.

Heat pipe 501 is an electrically conductive tube that is fabricated into a helical or cylindrical spiral including at least one complete turn to provide a coil that functions electrically as an inductor. The coil can include additional turns, and a number of turns and dimensions of the coil can be selected based on a desired inductance and a desired resonant frequency realized by the inductance and the value of capacitor 503. Heat pipe 501 can include a metal tube that is partially evacuated of air, and to which a material that can undergo a phase liquid-gas phase change at a desired range of operating temperatures. For example, heat pipe 501 can include a copper tube containing a mixture of air/water vapor and water. Another metal and liquid can be selected based on the temperature of heat pipe 501 during operation. In one embodiment, the diameter of the metal tube can be one millimeter or less. The inductor can be attached to a magnetic shield, such as magnetic shield 402 at FIG. 4a.

During operation of system 500, inefficiencies in power transmission and heat from a device that is being charged can increase the temperature of the antenna. A liquid inside heat pipe 501 is vaporized by the heat and the vapor travels to heat sink 502 where the vapor condenses back to a liquid state. Heat sink 502 can include a passive or an active cooling device, such as metal chassis, a fluid to fluid heat exchanger, and the like. In one embodiment a wicking material can be incorporated on an inside surface of heat pipe 501 tubing. The condensed liquid can travel from heat sink 502 to the inductor coil by a capillary action provided by the wicking material. In another embodiment, a wicking structure is not used, and an orientation of the heat pipe is such that gravitational force is used to pump the liquid back to the evaporative region. This embodiment may be referred to as a thermosiphon. During operation, the process of evaporation and condensation is repeated as long as the temperature at the antenna is elevated relative to the temperature at heat sink 502. One of skill will appreciate that while a particular heat pipe construction is described, any type of heat pipe including an electrically conductive material can be used to fabricate a wireless power antenna inductor.

Figure 5B:
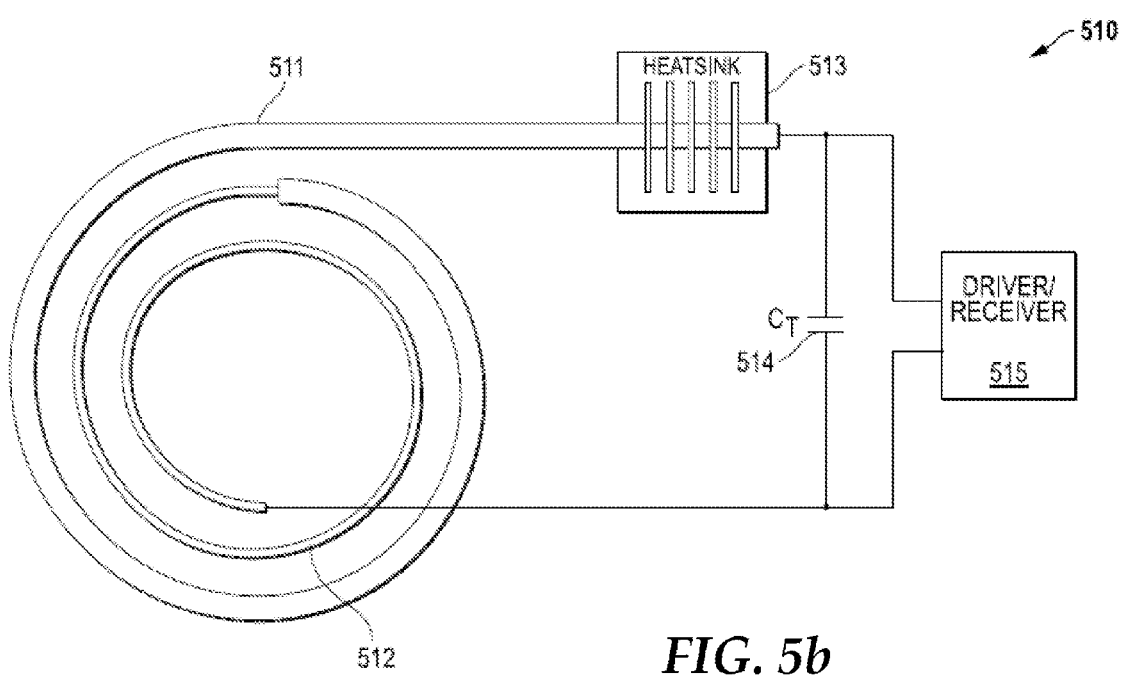
FIG. 5b is a block diagram illustrating a wireless power system including an antenna utilizing a heat pipe according to another embodiment of the present disclosure.

FIG. 5b is a block diagram illustrating a wireless power system 510 including an antenna utilizing a heat pipe according to another embodiment of the present disclosure. System 510 includes a wireless power antenna including a heat pipe 511 connected in series with a wire 512. System 510 further includes a heat sink 513, a tank capacitor 514, and a driver/receiver 515. Operation of wireless power system 510 is similar to system 500 of FIG. 5a, however the inductance of the antenna coil is determined based on a number of turns of heat pipe 511 and the number of turns of wire 512. Operation of system 510 is the same as described above with reference to system 500.

Figure 5C:
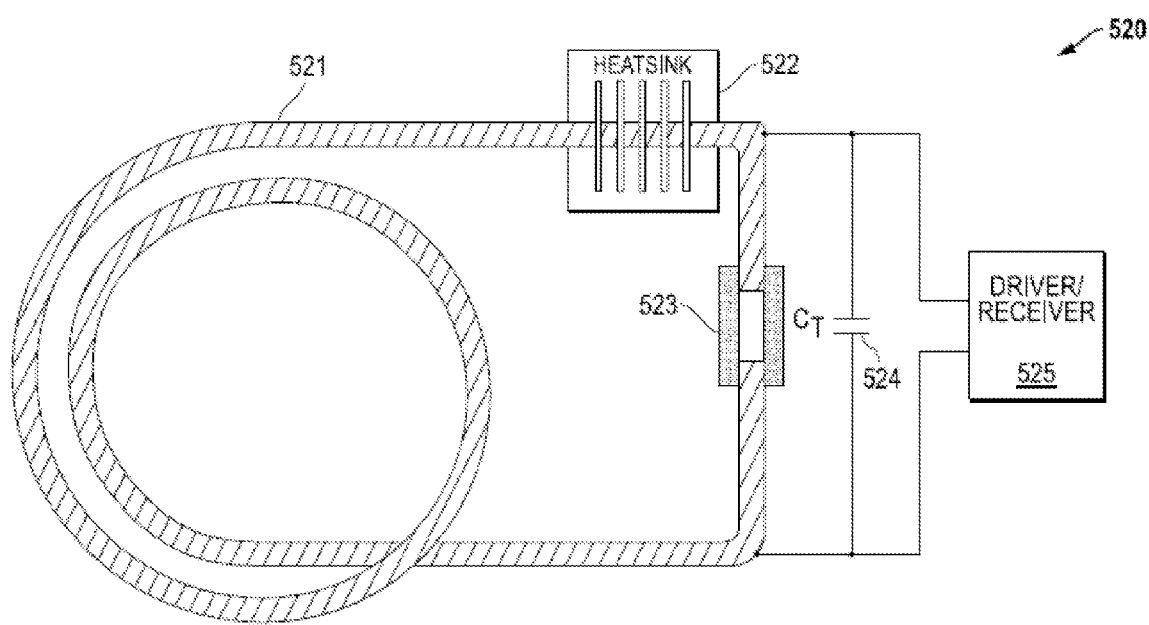
FIG. 5c is a block diagram illustrating a wireless power system including an antenna utilizing a heat pipe according to still another embodiment of the present disclosure.

FIG. 5c is a block diagram illustrating a wireless power system 520 including an antenna utilizing a heat pipe according to still another embodiment of the present disclosure. System 520 includes a heat pipe 521 arranged in a loop configuration, a heat sink 522, an electrical insulator 523, a tank capacitor 524, and a driver/receiver 525. Operation of system 520 is similar to system 500 described above. Insulator 523 is necessary so that the inductor provided by the coiled portion of heat pipe 521 is not electrically shorted. Insulator 523 can be a material such as plastic, ceramic, glass, or another material that is an electrical insulator and that can be formed and sealed to heat pipe 521 to allow the liquid and vapor inside heat pipe 521 to circulate throughout the length of the heat pipe loop.

In one embodiment, heat sinks 502, 513, and 522 can include carbon nanotubes arranged to conduct heat away from a condensation portion of the heat pipe. For example, a condensation portion of the heat pipe can be thermally coupled to a magnetic shield that includes carbon nanotubes, graphite, or another carbon material selected to provide thermal conductivity. Alternatively, or in addition, carbon nanotubes can be used to couple heat from the condensation portion of a heat pipe to a metal chassis or another component capable of radiating or dissipating heat. For example, a charging pad incorporating wireless power system 500, 510, or 520 can include a metal or carbon-containing enclosure to radiate heat conducted from the inductor heat pipe by carbon nanotubes. Similarly, wireless power system 500, 510, or 520 can be wireless power receivers included at a data processing device, and carbon nanotubes can be included in the enclosure housing the device to dissipate heat away from the condensation portion of the included heat pipe.

Figure 6A:
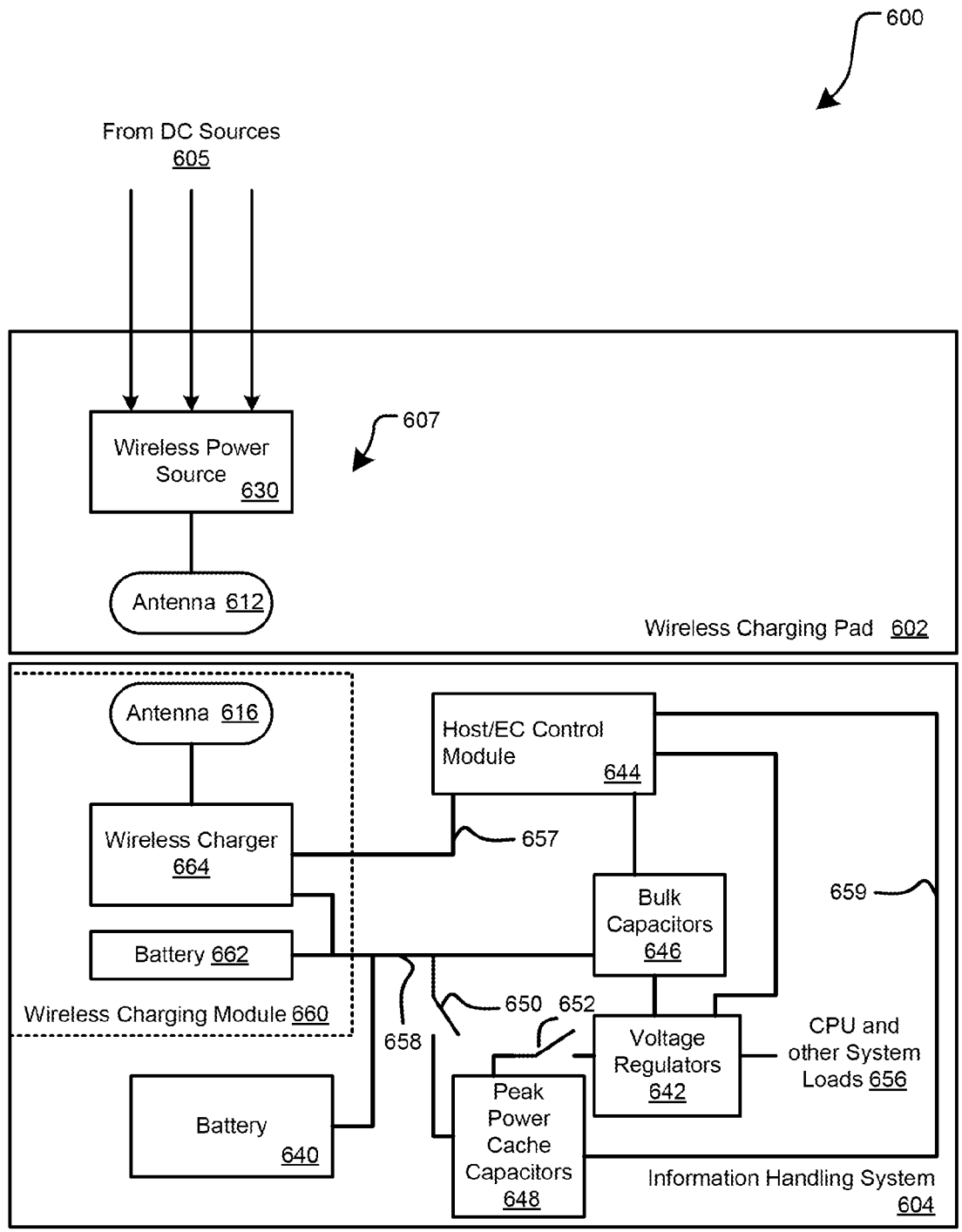
FIG. 6a is a diagram illustrating peak power caching in an information handling system according to an embodiment of the present disclosure.

FIG. 6a shows a wireless power delivery system 600 according to an embodiment of the present disclosure. The wireless power delivery system 600 includes a wireless charging pad 602, an information handling system 604, and a plurality of direct current (DC) sources 605. The wireless charging pad 602 includes a landing pad 607, which in turn includes a wireless power source 630, and an antenna 612. The wireless power source 630 is in communication with the DC sources 605 and with the antenna 612.

The information handling system 604 includes a battery 640, voltage regulators 642, a host/embedded controller (EC) control module 644, bulk capacitors 646, power cache capacitors 648, switches 650 and 652, central processing unit 656, and a wireless charging module 660. The control module 644 is in communication with the voltage regulators 642, with the bulk capacitors 646, with the peak power cache capacitors 648 via communication bus 659, and with the switches 650 and 652. The switch 650 includes a first terminal coupled to the wireless charging module 660, and a second terminal coupled to the peak power cache capacitors 648. The switch 652 includes a first terminal coupled to the peak power cache capacitors 648 and a second terminal coupled to the voltage regulators 642, which in turn is coupled to the central processing unit 656 and other components of the information handling system 604.

The wireless charging module 660 includes an antenna 616, a battery 662, and a wireless charger 664. The antenna 616 is in communication with the wireless charger 664, which in turn is in communication with the control module 644 via the communication bus 657. The wireless charger 664 is also in communication with the battery 662, with the battery 640, and with the bulk capacitors 646 via the power connector 658. In an embodiment, the power connector 658 can be a system management bus, and the power connector can also include low power pins to provide power to logic components in the wireless charging module 660.

The voltage regulators 642 can provide multiple regulated voltages to different systems loads of the information handling system 604, such as the central processing unit 656, a memory, a display device, and the like. The control module 644 can be a hardware module, a software module, and/or any combination of a hardware and software module. For example, the control module 614 can be a power management integrated circuit, a power management unit, or the like. The plurality of DC sources 605 can include an automatic air source, an alternating current (AC)-to-DC source, and a universal serial bus (USB) power source, or the like.

In an embodiment, the wireless charger 664 can communicate with the control module 644 of the information handling system to provide information about the wireless charging module. For example, information can include a class of the wireless charging module 660, an amount of power that the wireless charging module can provide, a type of the wireless charging module, and the like.

When the information handling system 604 containing the wireless charging module 660 is placed on landing pad 607 of the wireless charging pad 602, the wireless power source 630 can provide power to the antenna 612, which in turn can wirelessly provide the power to the antenna 616 of the wireless charging module 660. In an embodiment, the antenna 616 can receive a magnetic flux field from the antenna 612 and this magnetic flux field can induce power to be received by the wireless charger 664. The wireless charging pad 602 can use one or more techniques to provide power wirelessly, including inductive techniques, resonant inductive techniques, capacitive transfer techniques, beamed power transfer, such as laser or microwave transfer, or the like.

The antenna 616 can receive the wireless power from the antenna 612, and can provide power to the wireless charger 664. The wireless charger 664 can then convert the power received from the antenna 616 to a power level and a voltage level that can be utilized by the information handling system 604, such as forty-five or sixty-five Watts and nineteen and a half volts. The wireless charger 664 can either supply the converted power to the battery 640, the peak power cache capacitors 648, or the voltage regulators 642. In an embodiment, the bulk capacitors 646 buffer the power provided by the wireless charging module 660 on the power connector 658 before the power is provided to the voltage regulators 642.

The power provided to the battery 640 can be used to charge the battery, the power provided to the peak power cache capacitors 648 can be used to charge the capacitors, and the power provided to the voltage regulators 642 can be supplied at a proper voltage to the remaining components of the information handling system 604. If the battery 640 is fully charged and the information handling system 604 does not require the entire amount of power received by the wireless charging module 660 from the wireless charging pad 602, the wireless charger 664 can provide the remaining power to the battery 662. The power provided to the battery 662 can be used to charge the battery or to provide power to the peak power cache capacitors 648.

The control module 644 can receive information about the power provided by the wireless charging pad 602 from the wireless charger 664. The information can include a total amount of power that the wireless charging pad is able to provide or the like. The control module 644 can also determine information about the information handling system 604, such as a percentage of the battery 640 that is charged, an operation mode of the information handling system, and the like.

In an embodiment, the control module 644 can receive a turbo mode request to operate the central processing unit 656 in a turbo mode. The control module 644 can then determine if the peak power cache capacitors 648 have sufficient stored energy to provide the power to operate the central processing unit 656 in a turbo mode. If the peak power cache capacitors 648 do not have the amount of power for the turbo mode, the control module 644 can determine whether the wireless charging module 660 has sufficient power delivery capability to charge the peak power cache capacitors 648. In an embodiment, the power delivery capability of the wireless charging module 660 can be determined based on the power delivery capability of the wireless charger 664, the power delivery capability of battery 662, the combined power delivery capability of both the wireless charger and the battery, or the like.

The control module 644 can determine whether the wireless charging module 660 has sufficient power delivery capability by comparing the power delivery capability of the wireless charging module to a threshold value. In an embodiment, the threshold value can be the amount of power delivery capability needed to charge the peak power cache capacitors 648. If the control module 644 determines that the power delivery capability of the wireless charging module 660 is less than a threshold amount needed to charge the peak power cache capacitors 648, the control module can deny the turbo mode request. However, if the control module 644 determines that the power delivery capability of the wireless charging module 660 is substantially equal to or greater than threshold amount needed to charge the peak power cache capacitors 648, the control module can enable the turbo mode, and close switch 650 to enable the wireless charging module to provide power to the peak power cache capacitors.

In an embodiment, the voltage of the peak power cache capacitors 648 should be substantially equal to the voltage of the bulk capacitors 646 before the peak power cache capacitors discharge the stored energy and provide the energy to the voltage regulators 642. The control module 644 can compare the voltage of the peak power cache capacitors 648 to the voltage of the bulk capacitors 646. The control module 644 can then determine that the peak power cache capacitors 648 are ready to provide power to the voltage regulators 642 and can open switch 650 in response to the voltage of the peak power cache capacitors matching the voltage of the bulk capacitors 646. In an embodiment, the power provided to the central processing unit 656 and other components of the information handling system 604 is power delivered cycles. In an embodiment, the power from the peak power cache capacitors 648 should be provided at the start of a power delivery cycle. Thus, the control module 644 can monitor the voltage regulators 642 to detect a start of a power delivery cycle.

The control module 644 can then close switch 652 in response to the control module enabling the turbo mode, determining that the wireless charging module 660 has sufficient power delivery capability, determining that the voltage in the peak power cache capacitors 648 match the voltage of the bulk capacitors 646, and detecting a start of the power delivery cycle. The peak power cache capacitors 648 can then rapidly provide all of the energy stored in the peak power cache capacitors to the voltage regulators 642. In an embodiment, the peak power cache capacitors 648 can provide all of the energy in ten milliseconds, eleven milliseconds, twelve milliseconds, or the like. The control module 644 can then disable the turbo mode at the end of the power delivery cycle that the power was provided from the peak power cache capacitors 648 to the voltage regulators 642. In an embodiment, the control module 644 will deny all turbo mode requests received during the power delivery cycle immediately subsequent to the discharge of the peak power cache capacitors 648.

Figure 6B:
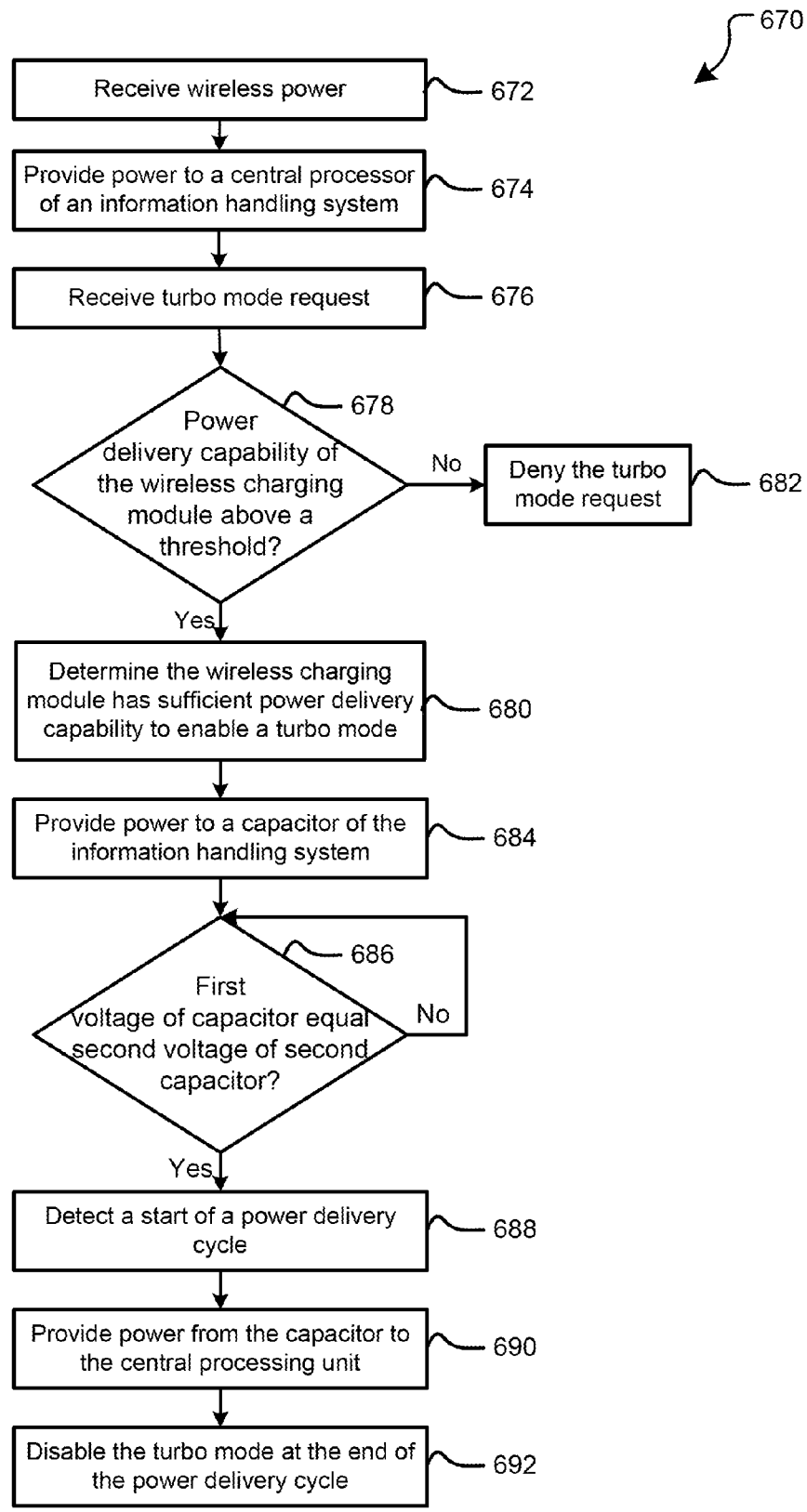
FIG. 6b is a diagram illustrating a method for caching peak power in an information handling system via a wireless charging module according to an embodiment of the present disclosure.

FIG. 6b shows a method 670 for caching peak power in an information handling system via a wireless charging module according to an embodiment of the present disclosure. At block 672, wireless power is received at an antenna of a wireless charging module of the information handling system from an antenna of a wireless charging pad. Power is provided to the central processing unit of the information handling system at block 674. In an embodiment, the power is provided by a wireless charger of the wireless charging module. At block 676, a turbo mode request is received. In an embodiment, the turbo mode can be received at a control module of the information handling system, and the request can be to operate a central processing unit of the information handling system in a turbo mode.

A determination is made whether the power delivery capability of the wireless charging module is above a threshold at block 678. At block 680, if the power delivery capability of the wireless charging module is above the threshold, the wireless charging module is determined to have sufficient power delivery capability to enable a turbo mode of the information handling system. Otherwise, if the power delivery capability of the wireless charging module is above the threshold, the turbo mode request is denied at block 682.

At block 684, power is provided to a capacitor in response to receiving the turbo mode request and determining that the wireless charging module has sufficient power delivery capability. In an embodiment, the capacitor can be a peak power cache capacitor. In an embodiment, the power is provided to the capacitor from the wireless charger of the wireless charging module. In an embodiment, the power is provided to the capacitor from a battery of the wireless charging module. At block 686, a determination is made whether a first voltage of the capacitor is substantially equal to a second voltage of a second capacitor in the information handling system. In an embodiment, the second capacitor can be a bulk capacitor providing power to voltage regulators of the information handling system. After the first voltage of the capacitor is substantially equal to the second voltage of the second capacitor in the information handling system, a start of a power delivery cycle is detected at block 688. At block 690, power for the turbo mode is provide from the capacitor in response to the first voltage being substantially equal to the second voltage. A turbo mode is disabled in response to an end of a power delivery cycle subsequent to the power being delivered from the capacitor at block 692.

Figure 7A:
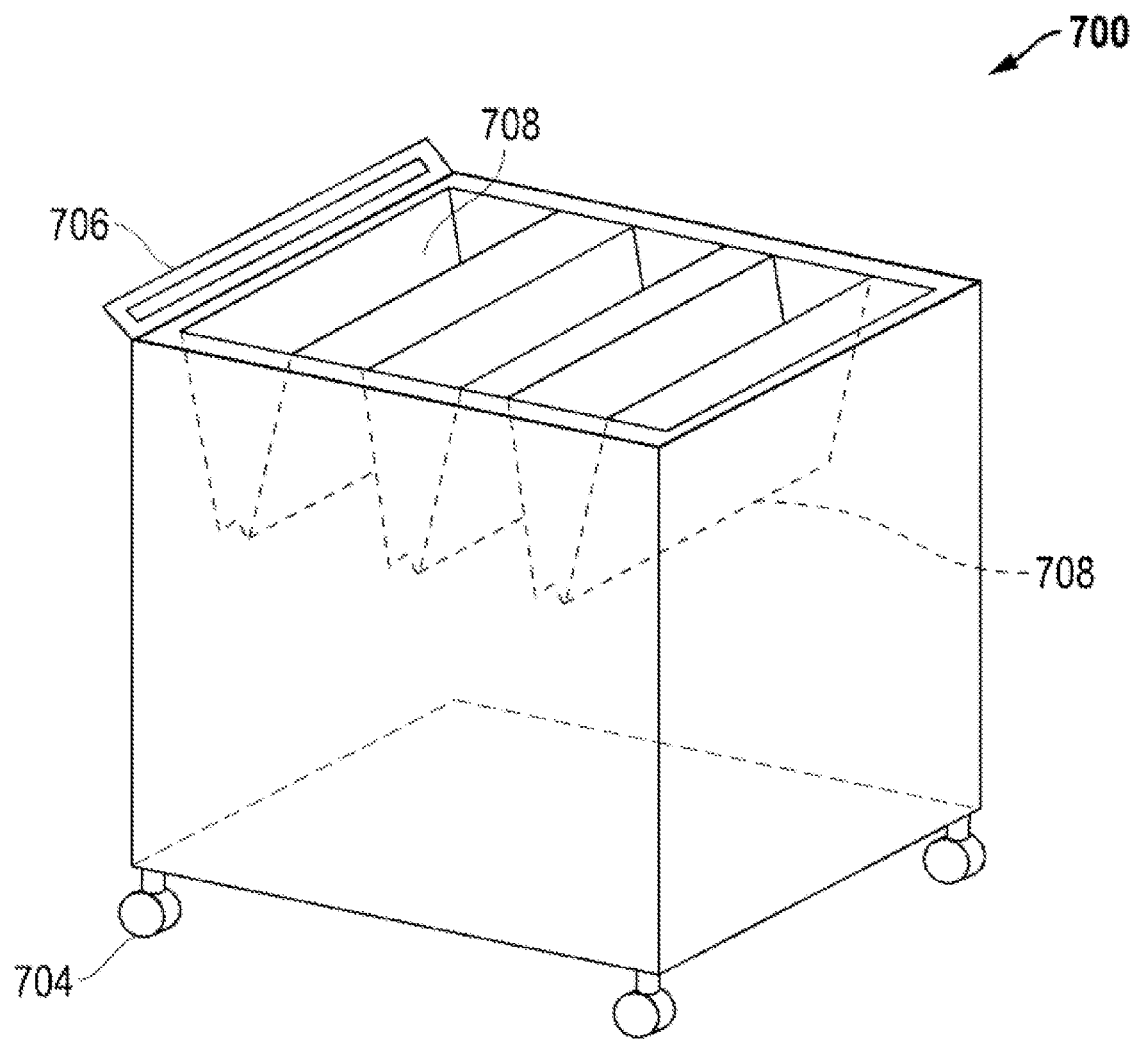
FIG. 7a is a diagram illustrating a cart for wirelessly recharging mobile computing devices.
Figure 7B:
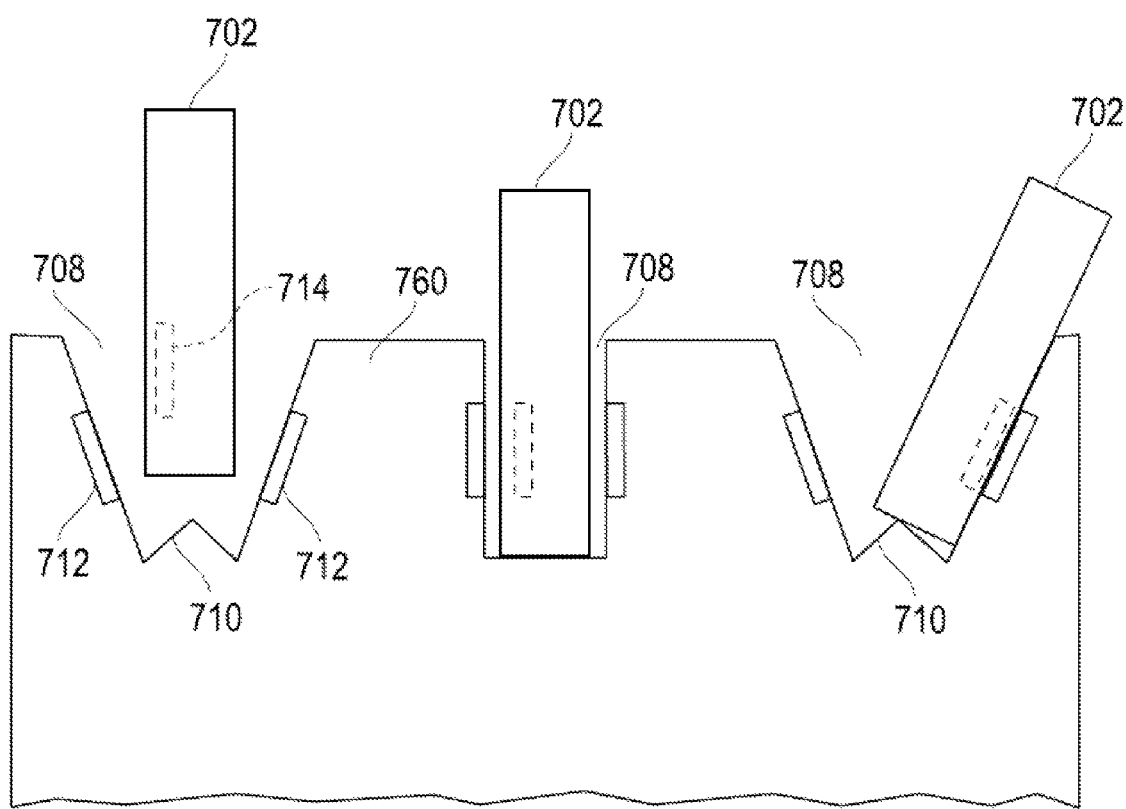
FIG. 7b is a diagram illustrating a portion of the cart.

FIGS. 7a and 7b show a cart 700 for wirelessly recharging mobile computing devices 702. The cart 700 includes wheels 704, one or more handles 706, and a plurality of slots 708 that are configured to receive the mobile computing devices. In the embodiment shown in FIG. 7b, the slots may have a variety of configurations, each of which results in the mobile computing device 702 extending at least partially from its respective slot. For example, the bottom of the slot may have a ridge 710. The ridge 710 may be hinged such that it extends to lay generally flat, as shown in the middle slot of FIG. 7b, or the ridge may be rigid so as to deflect the mobile computing device 702 toward one side of the slot 708.

The resilience of the ridge(s) 710 are preferably chosen in order to bring transmit coils 712 embedded in the cart into opposition with receive coils 714 in the mobile computing device 702. Because each mobile computing device 702 is normally equipped with only a single, asymmetrically disposed receive coil 714, the wireless power management system of the cart 700 may recognize which of the two coils 712 provided in each slot is closer to the receive coil 714. When that determination has been made, then the system may energize only the transmit coil better situated to deliver wireless power, which is normally the closer transmit coil.

Figure 7C:
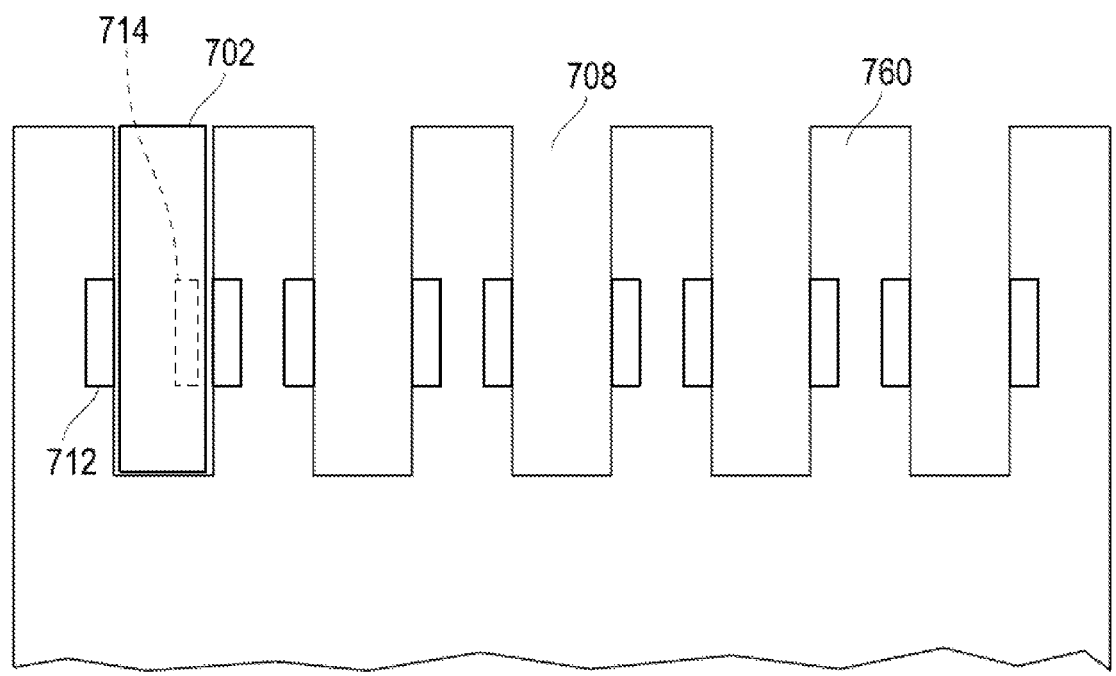
FIG. 7c is a diagram illustrating an alternative embodiment of the portion of the cart.

FIG. 7c shows an alternative embodiment 750 of the wireless recharging cart. In this embodiment, the slots 708 may have a depth to accept full insertion of the mobile computing device 702 such that the device does not extend above the top of the slots. Depending on the orientation of the device 702 upon insertion, the receive coil 714 may be disposed more proximate to the transmit coil 712 on the right side of the slot as shown in FIG. 7c. The device 702 and the slot 708 may also be provided with complimentary peripheries that require a single registration, and thus accommodate only a single correct method of insertion. In this latter case, each slot 708 need only be provided with a single corresponding transmit coil 712.

In either of the embodiments shown in FIG. 7b or 7c, the plates 760 situated between the slots are preferably plastic, and impregnated with iron or provided with iron inserts sufficient to magnetically isolate the transmit coils on each plate. At least one feature of such a design is to allow any given plate to generate bidirectional charging. The cart may thus charge mobile computing devices in adjacent slots. In the alternative the cart may selectively charge fewer than all slots. For example, the management system of the cart may determine to charge only three of ten filled slots.

The cart 700 or 705 may be connected to a network, such as a local area network or a cellular network, either by wire or wirelessly. The slots 708 of either FIG. 7b or 7c in turn may be provided with wired Ethernet connections (not shown) that mate with corresponding Ethernet ports on the mobile computing devices. Alternatively the cart 700 or 705 may be provided with a wireless access point. Any of these configurations allow for network management of the mobile computing devices, such as the provision of software updates.

Figure 8:
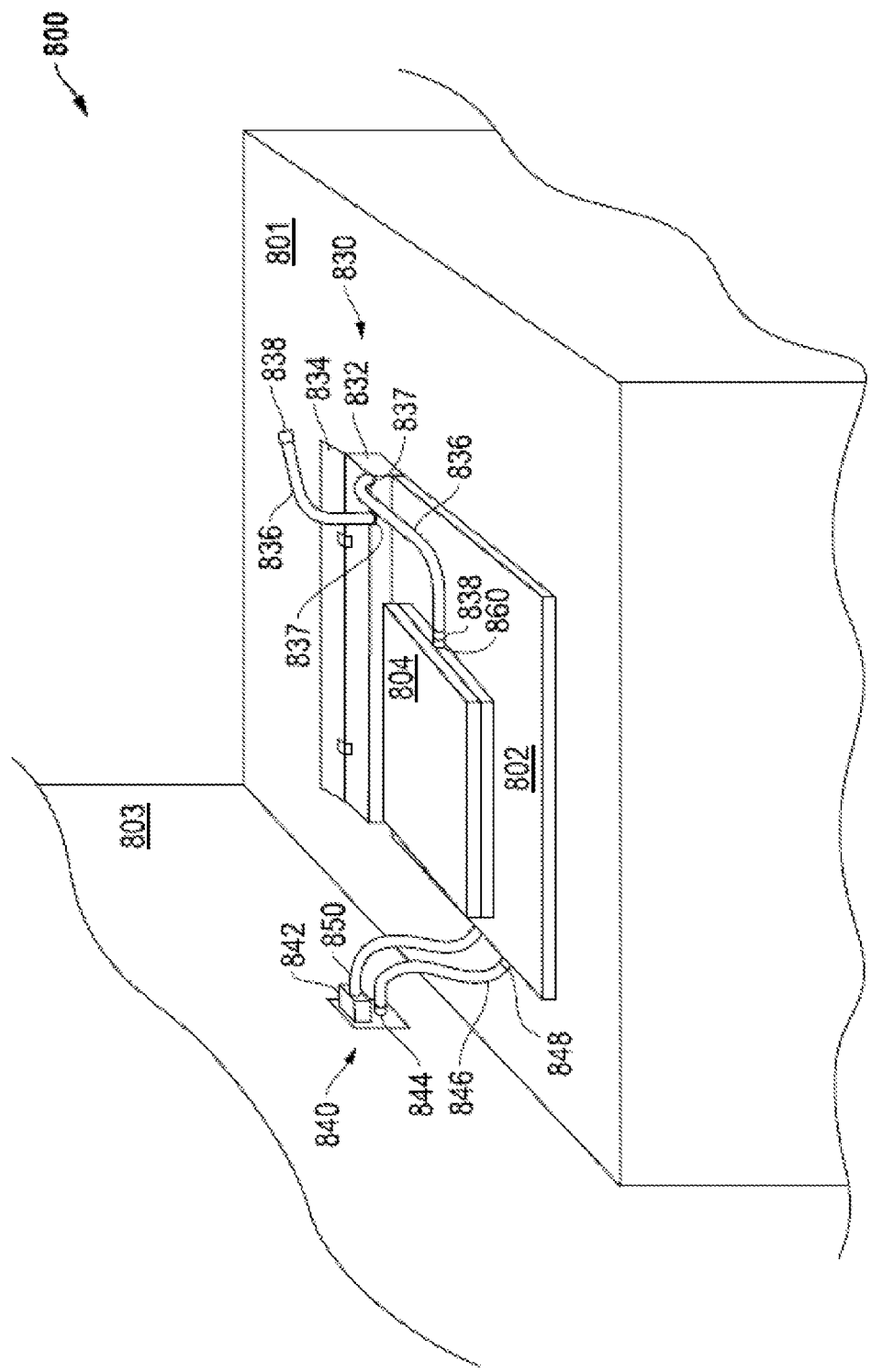
FIG. 8 diagram illustrating a security tie access point for a charging pad of the wireless power delivery system according to an embodiment of the present disclosure.

FIG. 8 is a diagram illustrating a wireless power delivery system 800 according to an embodiment of the present disclosure. The wireless power delivery system 800 includes a wireless charging pad 802 and a device securing component 830. The wireless power delivery system 800 can be placed in physical communication with a surface 801, such as a table top or counter top, and can be located within close proximity with a wall 803. In an embodiment, an information handling system 804 can be placed in physical communication with the wireless charging pad 802, and the information handling system can then be wirelessly charged by the wireless charging pad as described above with respect to FIG. 1. The device securing component 830 can include a tray 832, a lid 834, one or more security ties 836, and one or more notches 837 in the tray. Each of the security ties 836 includes a locking mechanism 838. A mounting plate 840 can be securely attached to the wall 803, and the mounting plate can include a power outlet 842 and a mount 844. In different embodiments, the mounting plate 840 may include the power outlet 842, as shown in FIG. 8, or the mounting plate may be separate from the power outlet on the wall 803. In an embodiment, a security tie 846 includes a locking mechanism 848 can be connected to the mounting plate via the mount 844. In an embodiment, the security ties 836 and 846 can be made from any durable material that is not easily broken or cut, such as Kevlar, steel strand cable, or the like.

During operation of the wireless power delivery system 800, the power outlet 842 can provide power to the wireless charging pad 802 via a power cord 850. A wireless charging antenna of the information handling system 804 can be aligned with a wireless charging antenna of the charging pad 802 to enable the information handling system to be wirelessly charged by the charging pad as described above with respect to FIG. 1. The charging pad 802 may be placed or located in an area that a lot of individuals have access to, such as a common area in an office building, a business, or the like. In an embodiment, a business can provide the wireless charging pad 802 for the use of customers of that business, so that the customers can charge their devices while shopping in the business. In this situation, the business providing the wireless charging pad 802 may want to secure the wireless charging pad via the security tie 846 so that an individual or customer cannot steal the charging pad.

In an embodiment, the security tie 846 can be integrated within the mounting plate 840, such that the security tie is permanently and securely connected to and part of the mounting plate. In another embodiment, the security tie 846 can be securely connected to the mounting plate 840 via the mount 844. In an embodiment, the mount 844 may be a lock that can be opened and closed using a key, a combination entered into the lock, or the like. The security tie 846 can extend from the mounting plate 840 and can attach to the charging pad 802 via the locking mechanism 848. In another embodiment, the security tie 846 can be permanently connected to the charging pad 802 without the use of the locking mechanism 848. Thus, the security tie 846 can securely connect the charging pad 802 to the mounting plate 840, such that an individual cannot move the charging pad more than a particular distance from the mounting plate as defined by the length of the security tie.

The device securing component 830 is securely connected to the charging pad 802. In different embodiments, the device securing component 830 can extend an entire length of a side of the charging pad 802, extend along only a portion of the length of a side of the charging pad, extend over the length of a side of the charging pad, extend along multiple sides of the charging pad, or the like. In an embodiment, the size, such as length, width, and height, of the device securing component 830 can be selected to fit different numbers of security ties 836 within the tray 832 and to allow the lid 834 to completely close on top of the tray while all of the security ties are within the tray. For example, if the charging pad 802 includes a single charging antenna, such that only one device can be wirelessly charged on the charging pad at a time, the dimensions of the tray 832 can be selected to fit only a single security tie 836 within the tray. However, if the charging pad 802 includes multiple charging antennas, the dimensions of the tray 832 can be selected to fit the same number of security ties 836 as the number of charging antennas within the tray. In an embodiment, the dimensions of the tray 832 may be selected to hold a larger number of security ties 836 than the number of charging antennas, a smaller number of security ties than the number of charging antennas, or the same number of security ties than the number of charging antennas.

If an individual would like to have an information handling system or device securely charged, the individual can place the information handling system 804 on the charging pad 802, and can then retrieve a security tie 836 out of the tray 832 of the device securing component 830. The information handling system 804 can include a locking mechanism 860 that is capable of interfacing with and connecting with the locking mechanism 838 of the security tie 836. In different embodiments, the locking mechanism 838 can be a key lock, a combination lock, or the like. For example, the locking mechanism 838 can be designed such that a key can rotate the locking mechanism between an unlocked position and a locked position, and the key can only be removed from the locking mechanism when the locking mechanism is in the locked position. In this embodiment, each locking mechanism 838 of the security ties 836 can have a different key, and only the specific key for a locking mechanism can unlock that particular locking mechanism. Thus, the individual can connect the information handling system 804 to the security tie 836 by connecting the locking mechanisms 838 and 860, and can then lock the locking mechanisms 838 and 860 together so that the information handling system is securely connected to the charging pad 802. If the locking and unlocking of the locking mechanism 838 is controlled via a key, the individual can then remove and take the key with him or her after the locking mechanism is locked so that only that individual can unlock and remove the information handling system 804 from the charging pad 802.

While the security tie 836 is connected to the information handling system 804, the security tie can be placed within a notch 837 of the tray 832. In an embodiment, each of the notches 837 can be shaped to fit the entire cross section of a security tie 836 so that the lid 834 can be completely closed on the tray 832 and the security tie can remain extended from the tray. If the individual decides to remove the information handling system 804 from the charging pad 802, the individual can unlock the locking mechanism 838 from the locking mechanism 860, and place the security tie 836 back within the tray 832.

Figure 9:
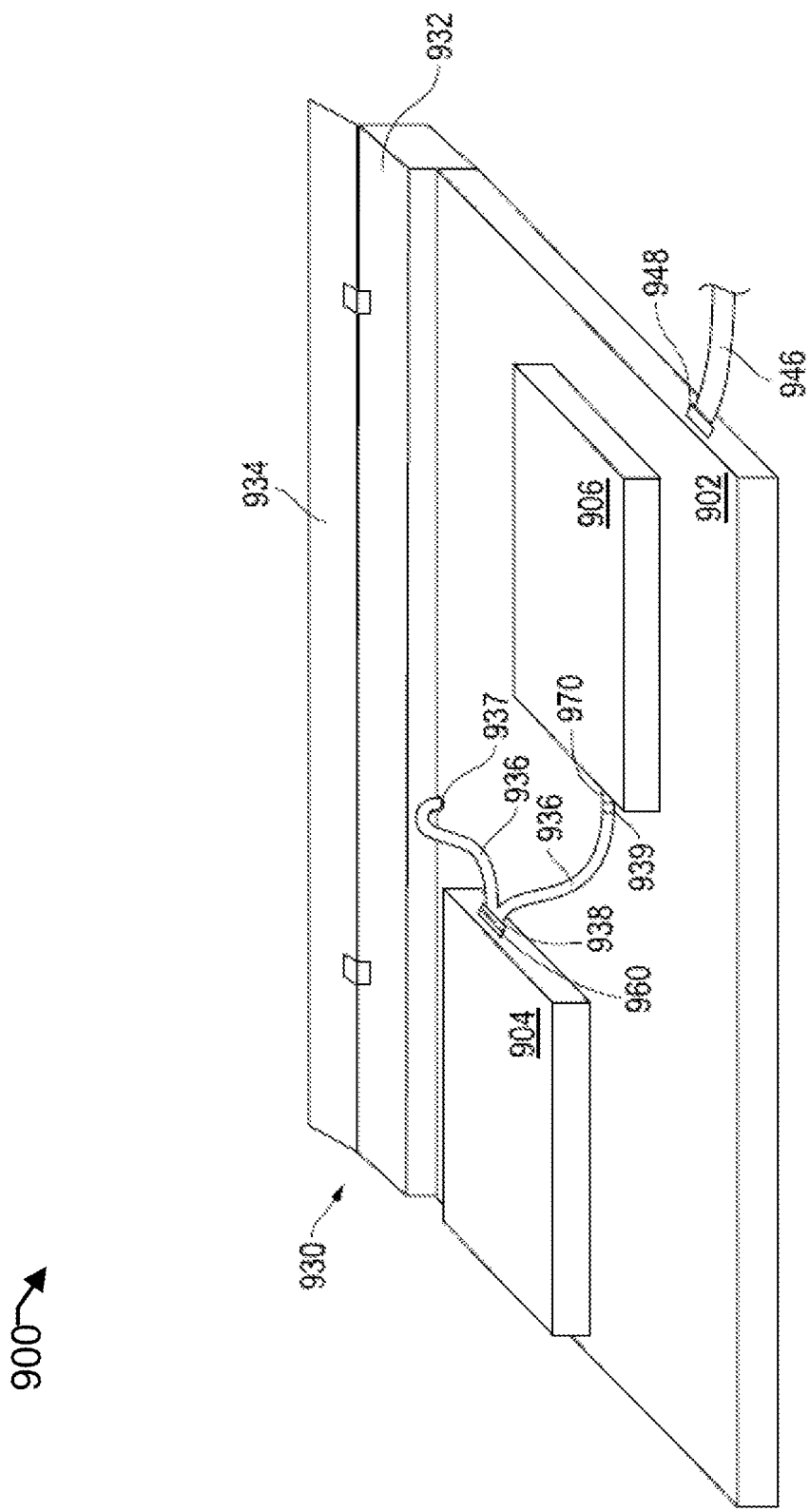
FIG. 9 another diagram illustrating a security tie access point for a charging pad of the wireless power delivery system according to an embodiment of the present disclosure.

FIG. 9 is a diagram illustrating a wireless power delivery system 900 according to an embodiment of the present disclosure. The wireless power delivery system 900 includes a wireless charging pad 902 and a device securing component 930. In an embodiment, information handling systems 904 and 906 can be placed in physical communication with the wireless charging pad 902, and the information handling systems can then be wirelessly charged by the wireless charging pad as described above with respect to FIG. 1. The device securing component 930 can include a tray 932, a lid 934, a security tie 936, and a notch 937 in the tray. In an embodiment, the security tie 936 includes one or more locking mechanisms 938. In an embodiment, a security tie 946 includes a locking mechanism 948 can be connected to a mounting plate, such as the mounting plate 840 of FIG. 8, via a mount as described above with respect to FIG. 8. In an embodiment, the security ties 936 and 946 can be made from any durable material that is not easily broken or cut, such as Kevlar, steel strand cable, or the like.

During operation of the wireless power delivery system 900, a wireless charging antenna of the information handling system 904 can be aligned with a wireless charging antenna of the charging pad 902, and a wireless charging antenna of the information handling system 906 can be aligned with another wireless charging antenna of the charging pad to enable both of the information handling systems to be wirelessly charged by the charging pad as described above with respect to FIG. 1. The charging pad 902 may be placed or located in an area that a lot of individuals have access to, such as a common area in an office building, a business, or the like. In this situation, the business providing the wireless charging pad 902 may want to secure the wireless charging pad via the security tie 946, as described above with respect to FIG. 8, so that an individual or customers cannot steal the charging pad.

The device securing component 930 can be securely connected to the charging pad 902. In an embodiment, the dimensions of the device securing component 930 can be selected based on the size and number of security ties 936 within the tray 932 and to allow the lid 934 to completely close on top of the tray while the security ties are within the tray. If an individual would like to have an information handling system or device securely charged, the individual can place the information handling system 904 on the charging pad 902, and can then retrieve the security tie 936 out of the tray 932 of the device securing component 930. In an embodiment, the security tie 936 can include multiple locking mechanisms 938 and 939 that are connected together, such as in a daisy chain configuration. In this embodiment, the security tie 936 can include a first locking mechanism 938 a predefined distance along the security tie, and the security tie can continue in length to another locking mechanism 939, such that both information handling systems 904 and 906 can be securely connected to the charging pad 902 via a single security tie.

The information handling system 904 can include a locking mechanism 960 that is capable of interfacing with and connecting with either the locking mechanism 938 or 939 of the security tie 936. Similarly, the information handling system 906 can include a locking mechanism 970 that is capable of interfacing with and connecting with either the locking mechanism 938 or 939 of the security tie 936. In an embodiment, the locking mechanism 938 can be designed such that a key can rotate the locking mechanism between an unlock position and a locked position, and the key can only be removed from the locking mechanism when the locking mechanism is in the locked position. In this situation, the individual can connect the information handling system 904 to the security tie 936 by connecting the locking mechanism 938 of the security tie to the locking mechanism 960 of the information handling system. The individual can then lock the locking mechanisms 938 and 960 together so that the information handling system 904 is securely connected to the charging pad 902.

The information handling system 906 can then be connected to the security tie 936 by connecting the locking mechanism 939 of the security tie to the locking mechanism 970 of the information handling system. The individual can then lock the locking mechanisms 939 and 970 together so that the information handling system 906 is securely connected to the charging pad 902. While the security tie 936 is connected to the information handling system 904 and/or information handling system 906, the security tie can be placed within a notch 937 of the tray 932 so that the lid 934 can be completely closed on the tray and the security cable can remain extended from the tray.

Figure 10:
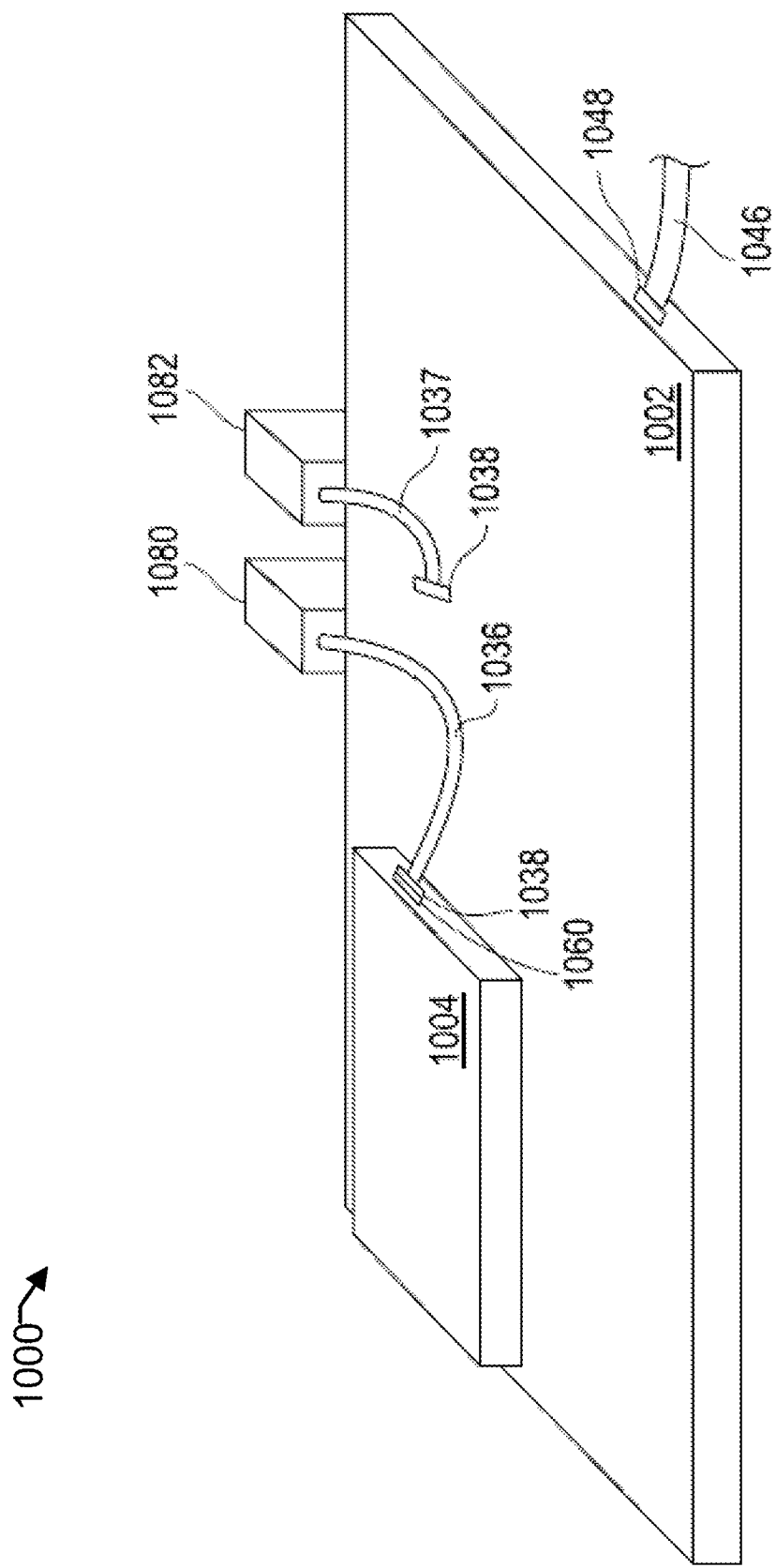
FIG. 10 diagram illustrating a security tie access point for a charging pad of the wireless power delivery system according to an embodiment of the present disclosure.

FIG. 10 is a diagram illustrating a wireless power delivery system 1000 according to an embodiment of the present disclosure. The wireless power delivery system 1000 includes a wireless charging pad 1002 and device securing components 1080 and 1082. In an embodiment, information handling system 1004 can be placed in physical communication with the wireless charging pad 1002, and the information handling system can then be wirelessly charged by the wireless charging pad as described above with respect to FIG. 1. The device securing component 1080 can include a security tie 1036 that can retractably extend from the device securing component. For example, the security tie 1036 can be pulled out of the device securing component 1080 and can be locked and held place in response to the security tie no longer being pulled. However, upon the security tie 1036 being fully extended from the device securing component 1080 and an individual pulling an additional amount on the security tie, the device securing component can retract the security tie.

During operation of the wireless power delivery system 1000, a wireless charging antenna of the information handling system 1004 can be aligned with a wireless charging antenna of the charging pad 1002 to enable the information handling system to be wirelessly charged by the charging pad as described above with respect to FIG. 1. In an embodiment, the device securing components 1080 and 1082 can be securely connected to the charging pad 1002. If an individual would like to have an information handling system or device securely charged, the individual can place the information handling system 1004 on the charging pad 1002, and can then pull on the security tie 1036 to extend the security tie out of the device securing component 1080.

The information handling system 1004 can include a locking mechanism 1060 that is capable of interfacing with and connecting with either the locking mechanism 1038 of the security tie 1036 or locking mechanism 1039 of the security tie 1037. In an embodiment, the locking mechanisms 1038 and 1039 can be designed such that a key can rotate the locking mechanism between an unlock position and a locked position, and the key can only be removed from the locking mechanism when the locking mechanism is in the locked position. In this situation, the individual can connect the information handling system 1004 to the security tie 1036 by connecting the locking mechanism 1038 of the security tie to the locking mechanism 1060 of the information handling system. The individual can then lock the locking mechanisms 1038 and 1060 together so that the information handling system 1004 is securely connected to the charging pad 1002. In an embodiment, the embodiment of the wireless power delivery system 1000 of FIG. 10 can be implemented and utilized with the embodiment of the wireless power delivery system 800 of FIG. 8 and/or the embodiment of the wireless power delivery 900 of FIG. 9, such that the wireless delivery system can include a device securing component 830 or 930 including a tray and cover, and one or more device securing components 1080 and 1082 with retractable security ties.

Figure 11A:
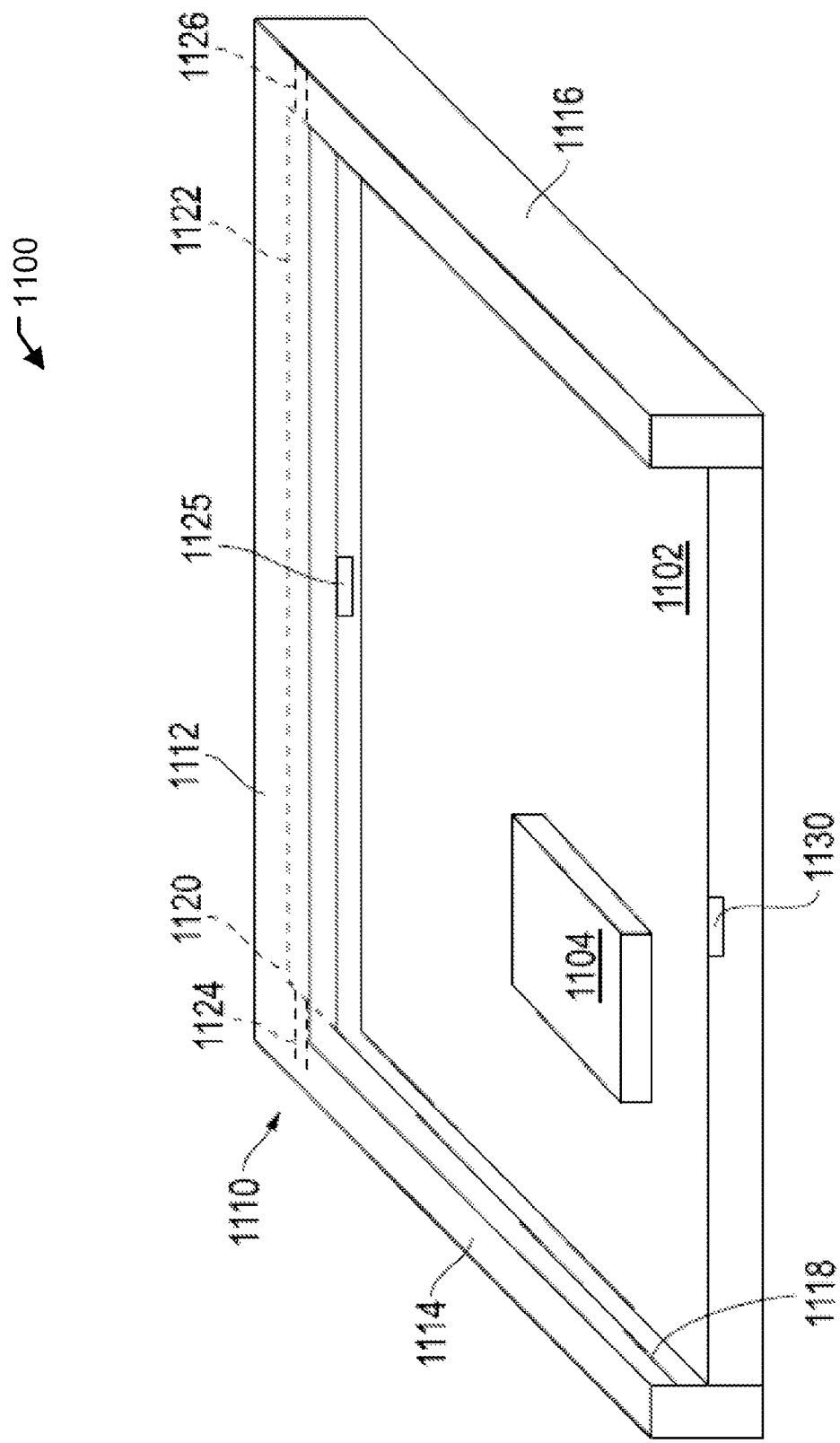
FIGS. 11a and 11b are diagrams illustrating an embodiment of a wireless power delivery system including a wireless charging pad and a pad covering device according to an embodiment of the present disclosure.
Figure 11B:
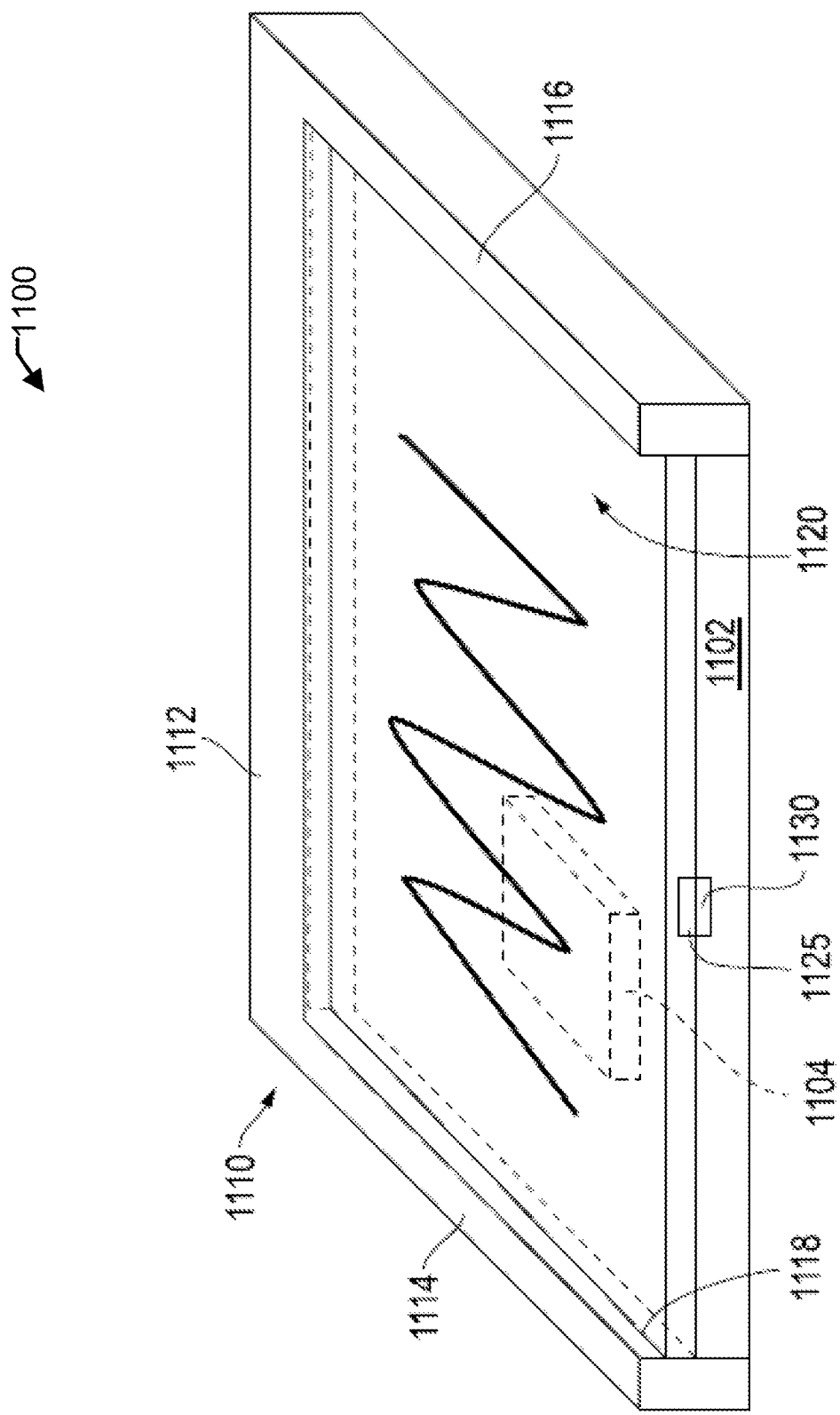

FIGS. 11a and 11b are two diagrams illustrating a wireless power delivery system 1100 according to an embodiment of the present disclosure. The wireless power delivery system 1100 includes a wireless charging pad 1102 and a pad covering device 1110. In an embodiment, an information handling system 1104 can be placed in physical communication with the wireless charging pad 1102, and the information handling system can then be wirelessly charged by the wireless charging pad as described above with respect to FIG. 1. In an embodiment, the wireless charging pad 1102 can be securely connected to a wall or other structure via a security tie as described above with FIGS. 8, 9, and 10.

The pad covering device 1110 includes a rear portion 1112, side portions 1114 and 1116, and a channel 1118. In an embodiment, a cover 1120 can be located within the rear portion 1112, and the cover can extend from the rear portion and move along the channel 1118. The cover 1120 includes a locking mechanism 1125, which in turn can connect and lock within a locking mechanism 1130 of the wireless charging pad 1102. In an embodiment, the cover 1120 can be made from any durable material that is not easily broken or cut, such as Kevlar or the like. In an embodiment, the cover 1120 can be opaque, such that when the cover is closed over the charging pad 1102 the information handling system 1104 cannot be seen by an individual near the charging pad.

During operation of the wireless power delivery system 1100, a wireless charging antenna of the information handling system 1104 can be aligned with a wireless charging antenna of the charging pad 1102 to enable the information handling system to be wirelessly charged by the charging pad as described above with respect to FIG. 1. In an embodiment, the information handling system 1104 can be placed on the wireless charging pad 1102 while the cover 1120 is located within the rear portion 1112 of the pad covering device 1110 as shown in FIG. 11a. However, the charging pad 1102 may be placed or located in an area that a lot of individuals have access to, such as a common area in an office building, a business, or the like. In this situation, an individual may want to securely cover the information handling system 1104 while the information handling system is wirelessly charging on wireless charging pad 1102.

The pad covering device 1110 is securely connected to the charging pad 1102. In an embodiment, the rear portion 1112 can extend an entire length of one side of the charging pad 1102, the side portion 1114 can extend along an entire length of another side of the charging pad, and the side portion 1116 can extend along an entire length of still another side of the charging pad. In an embodiment, the size, such as length, width, and height, of the pad covering device 1110 can be selected to fit the entire amount of the cover 1120 while the cover is rolled around a roller 1122, and the roller can be mounted within the rear portion 1112 via pins 1124 and 1126. In an embodiment, the pins 1124 and 1126 can enable the roller 1122 to rotate within the rear portion 1112 of the pad covering device 1110, and to enable the cover to extend from within the rear portion.

Referring now to FIG. 11b, as the cover 1120 extends from within the rear portion 1112, the cover can slide along within the channel 1118 until the cover is fully extended and the locking mechanism 1125 of the cover can connect with the locking mechanism 1130 of the charging pad. In different embodiments, the locking mechanisms 1125 and 1130 can be key locks, combination locks, or the like. For example, the locking mechanism 1125 can be designed such that after the locking mechanism 1125 is connected to the locking mechanism 1130 a key can rotate the locking mechanism from an unlocked position to a locked position. Thus, the individual can securely lock the information handling system 1104 within the wireless power delivery system 1100 by connecting the locking mechanisms 1125 and 1130, and then locking the locking mechanisms together so that the information handling system is securely held below the cover 1120. In an embodiment, the cover 1120 can both securely hold the information handling system 1104 on the charging pad 1102 and obstruct the view of the information handling system from other individuals. If the individual decides to remove the information handling system 1104 from the charging pad 1102, the individual can unlock the locking mechanism 1125 from the locking mechanism 1130, and allow roller 1122 to rotate and pull the cover 1120 back within the rear portion 1112 of the pad covering device 1110 along the channel 1118 of the side portions 1114 and 1116.

Figure 11C:
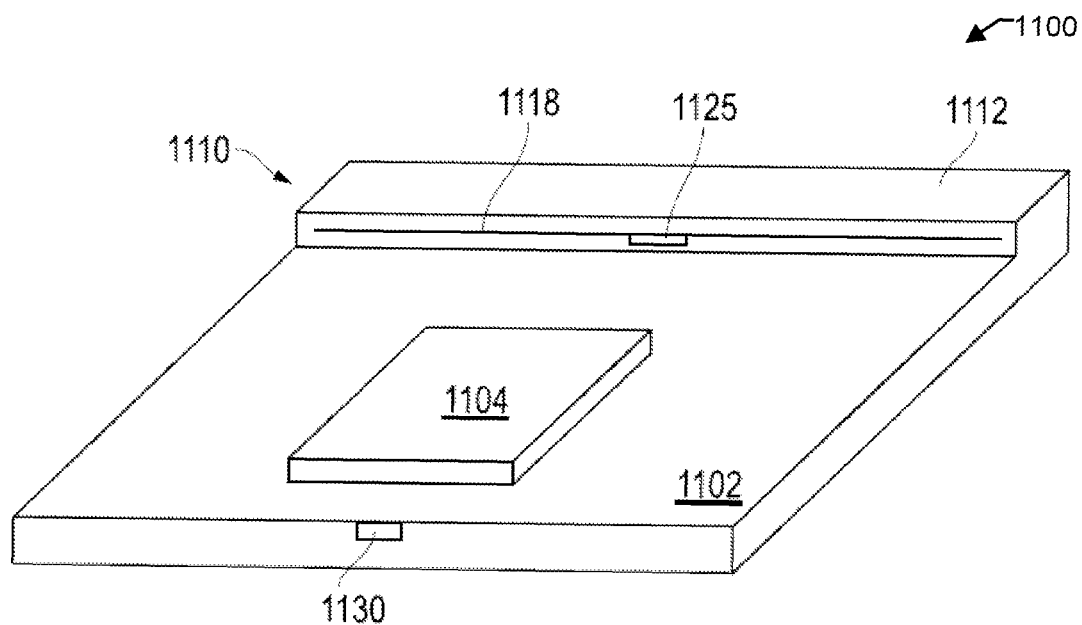
FIGS. 11c and 11d are diagrams illustrating another embodiment of a wireless power delivery system including a wireless charging pad and a pad covering device according to an embodiment of the present disclosure.
Figure 11D:
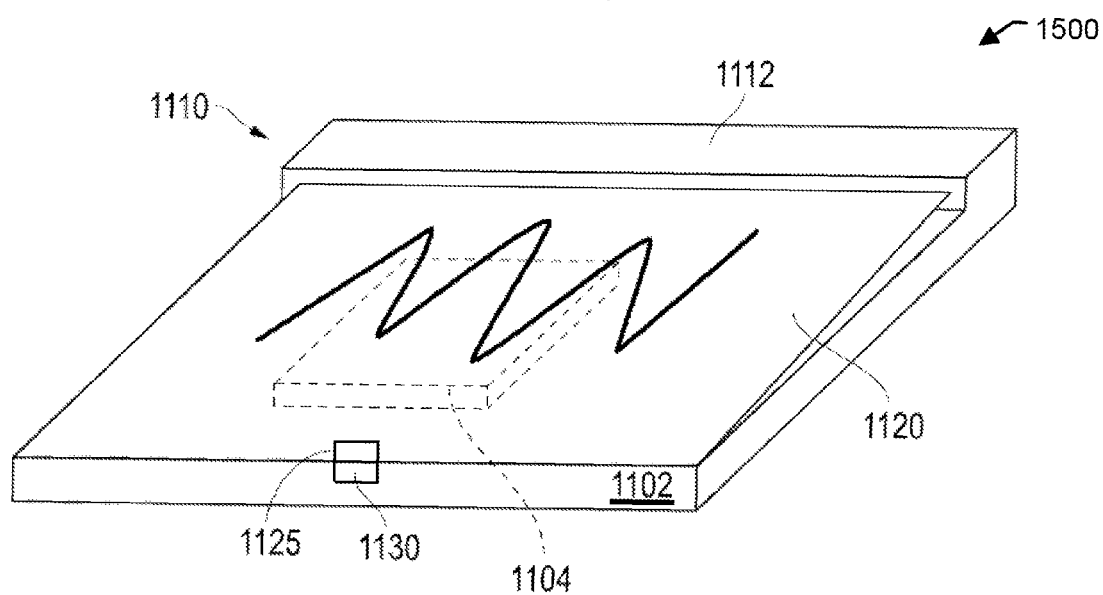

FIGS. 11c and 11d are two diagrams illustrating a wireless power delivery system 1100 according to an embodiment of the present disclosure. The wireless power delivery system 1100 includes a wireless charging pad 1102 and a pad covering device 1110. In an embodiment, an information handling system 1104 can be placed in physical communication with the wireless charging pad 1102, and the information handling system can then be wirelessly charged by the wireless charging pad as described above with respect to FIG. 1. In an embodiment, the wireless charging pad 1102 can be securely connected to a wall or other structure via a security tie as described above with FIGS. 8, 9, and 10.

The pad covering device 1110 includes a rear portion 1112 and a channel 1118. In an embodiment, a cover 1120 can be located within the rear portion 1112, and the cover can extend from the rear portion via the channel 1118. The cover 1120 includes a locking mechanism 1125, which in turn can connect and lock within a locking mechanism 1130 of the wireless charging pad 1102. In an embodiment, the cover 1120 can be made from any durable material that is not easily broken or cut, such as Kevlar or the like, and the cover can be opaque, such that when the cover is closed over the charging pad 1102 the information handling system 1104 cannot be seen by an individual near the charging pad.

During operation of the wireless power delivery system 1100, the information handling system 1104 can be placed on the wireless charging pad 1102 while the cover 1120 is located within the rear portion 1112 of the pad covering device 1110 as shown in FIG. 11c. In an embodiment, the pad covering device 1110 is securely connected to the charging pad 1102. In an embodiment, the rear portion 1112 can extend an entire length of one side of the charging pad 1102. In an embodiment, the size, such as length, width, and height, of the pad covering device 1110 can be selected to fit the entire amount of the cover 1120 while the cover is rolled around a roller, such as roller 1122 of FIGS. 11a and 11b.

Referring now to FIG. 11d, the cover 1120 can extend from within the rear portion 1112 via the channel 1118 until the cover is fully extended and the locking mechanism 1125 of the cover can connect with the locking mechanism 1130 of the charging pad. In different embodiments, the locking mechanisms 1125 and 1130 can be key locks, combination locks, or the like. An individual can securely lock the information handling system 1104 within the wireless power delivery system 1100 by connecting the locking mechanisms 1125 and 1130, and then locking the locking mechanisms together, via either a key or combination, so that the information handling system is securely held below the cover 1120. In an embodiment, the cover 1120 can both securely hold the information handling system 1104 on the charging pad 1102 and obstruct the view of the information handling system from other individuals. If the individual decides to remove the information handling system 1104 from the charging pad 1102, the individual can unlock the locking mechanism 1125 from the locking mechanism 1130, and allow roller 1122 to rotate and pull the cover 1120 back within the rear portion 1112 of the pad covering device 1110 via the channel 1118.

Figure 12A:
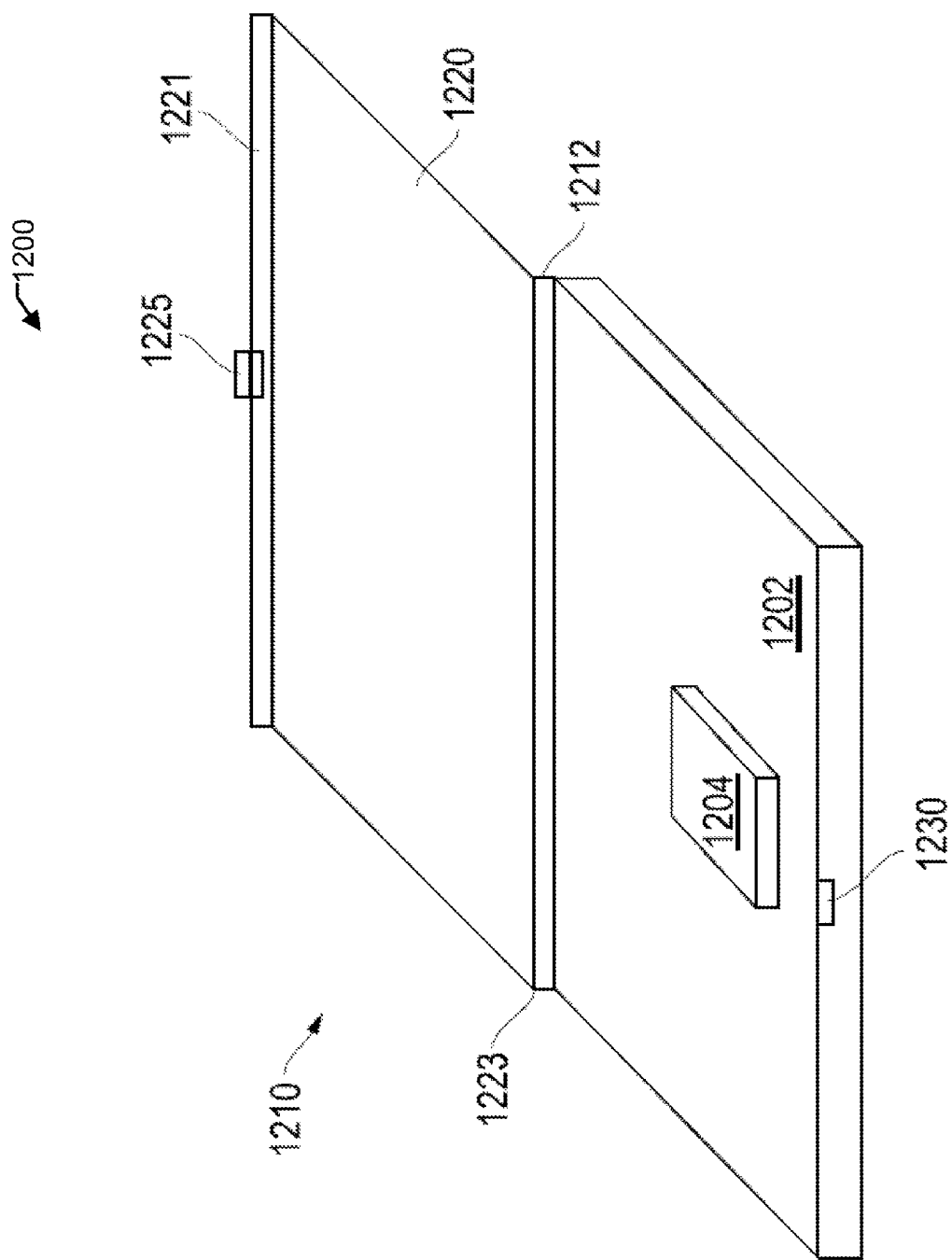
FIGS. 12a and 12b are diagrams illustrating another embodiment of a wireless power delivery system including a wireless charging pad and a pad covering device according to an embodiment of the present disclosure.
Figure 12B:
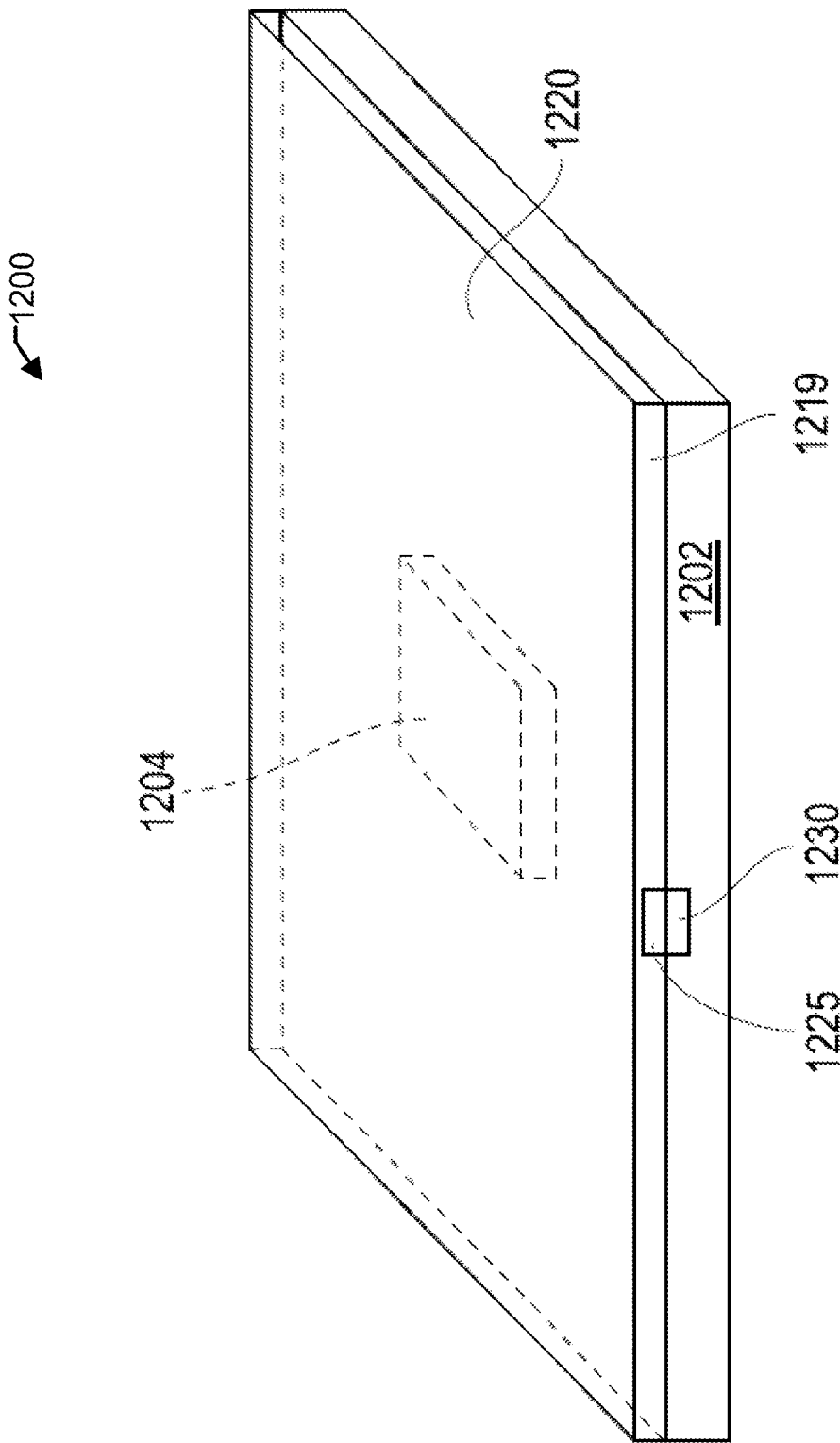

FIGS. 12a and 12b are two diagrams illustrating a wireless power delivery system 1200 according to an embodiment of the present disclosure. The wireless power delivery system 1200 includes a wireless charging pad 1202 and a pad covering device 1210. In an embodiment, an information handling system 1204 can be placed in physical communication with the wireless charging pad 1202, and the information handling system can then be wirelessly charged by the wireless charging pad as described above with respect to FIG. 1. In an embodiment, the wireless charging pad 1202 can be securely connected to a wall or other structure via a security tie as described above with FIGS. 8, 9, and 10.

The pad covering device 1210 includes a rear portion 1212, a cover 1220, a front portion 1221, a hinge 1223, and a locking mechanism 1225. In an embodiment, the cover 1220 can connect to the rear portion 1212 via the hinge 1223. In an embodiment, the locking mechanism 1225 can connect and lock within a locking mechanism 1230 of the wireless charging pad 1202. In an embodiment, the cover 1220 can be made from any durable material that is not easily broken or cut, such as Kevlar, hard plastic, or the like, and the cover can be opaque, such that when the cover is closed over the charging pad 1202 the information handling system 12204 cannot be seen by an individual near the charging pad.

During operation of the wireless power delivery system 1200, the information handling system 1204 can be placed on the wireless charging pad 1202 while the cover 1220 is located behind the charging pad, as shown in FIG. 12a, or off to one side or the other. In an embodiment, the rear portion 1212 of the pad covering device 1210 is securely connected to the charging pad 1202. In an embodiment, the rear portion 1212 can extend an entire length of one side of the charging pad 1202.

Referring now to FIG. 12b, the cover 1220 can rotate around the rear portion 1212 via the hinge 1223 until the locking mechanism 1225 of the cover can connect with the locking mechanism 1230 of the charging pad. In different embodiments, the locking mechanisms 1225 and 1230 can be key locks, combination locks, or the like. Thus, an individual can securely lock the information handling system 1204 within the wireless power delivery system 1200 by connecting the locking mechanisms 1225 and 1230, and then locking the locking mechanisms together, via either a key or combination, so that the information handling system is securely held below the cover 1220. In an embodiment, the cover 1220 can both securely hold the information handling system 1204 on the charging pad 1202 and obstruct the view of the information handling system from other individuals. If the individual decides to remove the information handling system 1204 from the charging pad 1202, the individual can unlock the locking mechanism 1225 from the locking mechanism 1230, and allow the cover 1220 to rotate around the rear portion 1212 of the pad covering device 1210 via the hinge 1223 until the information handling system 1204 can be removed from the charging pad 1202.

FIGS. 13a-d show a mobile computing device 1300 that includes a body 1302 and an articulating wireless power receiver or easel 1304. The body 1302 has a back side 1306 and a front side 1308. The easel 1304 is preferably adapted to fit within an indentation 1310 formed in the back side 1306 of the mobile computing device. The easel 1304 is normally biased to that position, as shown in FIG. 13a, by a universal hinge or joint 1312.

The mobile computing device 1300, which for example may be a cellular telephone or a tablet computer, typically has a display on its front side 1308. In order that the mobile computing device 1300 may be wirelessly recharged, the easel 1304 may be provided with a wireless power receiver coil 1314. With the easel 1304 in the position shown in FIG. 13a, the mobile computing device 1300 may be laid flat on its back side 1302 so that the coil 1314 is brought proximate to a wireless power transmitting coil, as is well known.

The easel 1304 may also be rotated about an axis extending out of the page as shown in FIG. 13b so that the easel may pass through a range of positions to (and beyond) that shown in FIG. 13b. The hinge 1312 may provide mechanical resistance or stops so that the device 1300 can rest in the orientation shown upon a horizontal surface 1316. In this way the mobile computing device 1300 may present its front side 1308 to a user and remain in use in a potentially more functional orientation. At the same time the receiver coil 1314 can be brought into opposition with a transmission coil 1318 in the horizontal surface 1316. Thus power wirelessly transmitted from the coil 1318 to the coil 1314 may recharge a battery 1320 connected in well know fashion to the coil 1314.

The universal hinge 1312 also allows the easel 1304 to rotate between the position shown in FIG. 13b and the position shown in FIG. 13c. Any of these orientations of the easel 1304 may be convenient, for example, to bring the coil 1314 into alignment with a transmission coil disposed in a non-standard manner, or to orient the mobile computing device 1300 in something other than a perfectly vertical or perfectly horizontal orientation. It also should be appreciated that the easel 1304 may be rotated an additional 180 degrees from the position shown in FIG. 13b about the axis extending perpendicular from the page, and then rotated 180 degrees about a perpendicular axis lying in the plane of the page so that the coil 1314 remains facing down, but extends generally under the device and from the front side 1308.

FIG. 13d shows an alternative embodiment of the mobile computing device that includes a wire 1322 connecting the hinge 1312 with the body 1302 of the device. This arrangement allows the easel 1304 to be extended away from the body 1302, thus providing an even greater number of relative orientations between the easel and the device 1300. A take up spool (not shown) within the body of the device 1300 may also provide a mechanism by which to retract the wire 1322 when a user desires to return the easel 1304 closer to the body 1302.

Figure 14A:
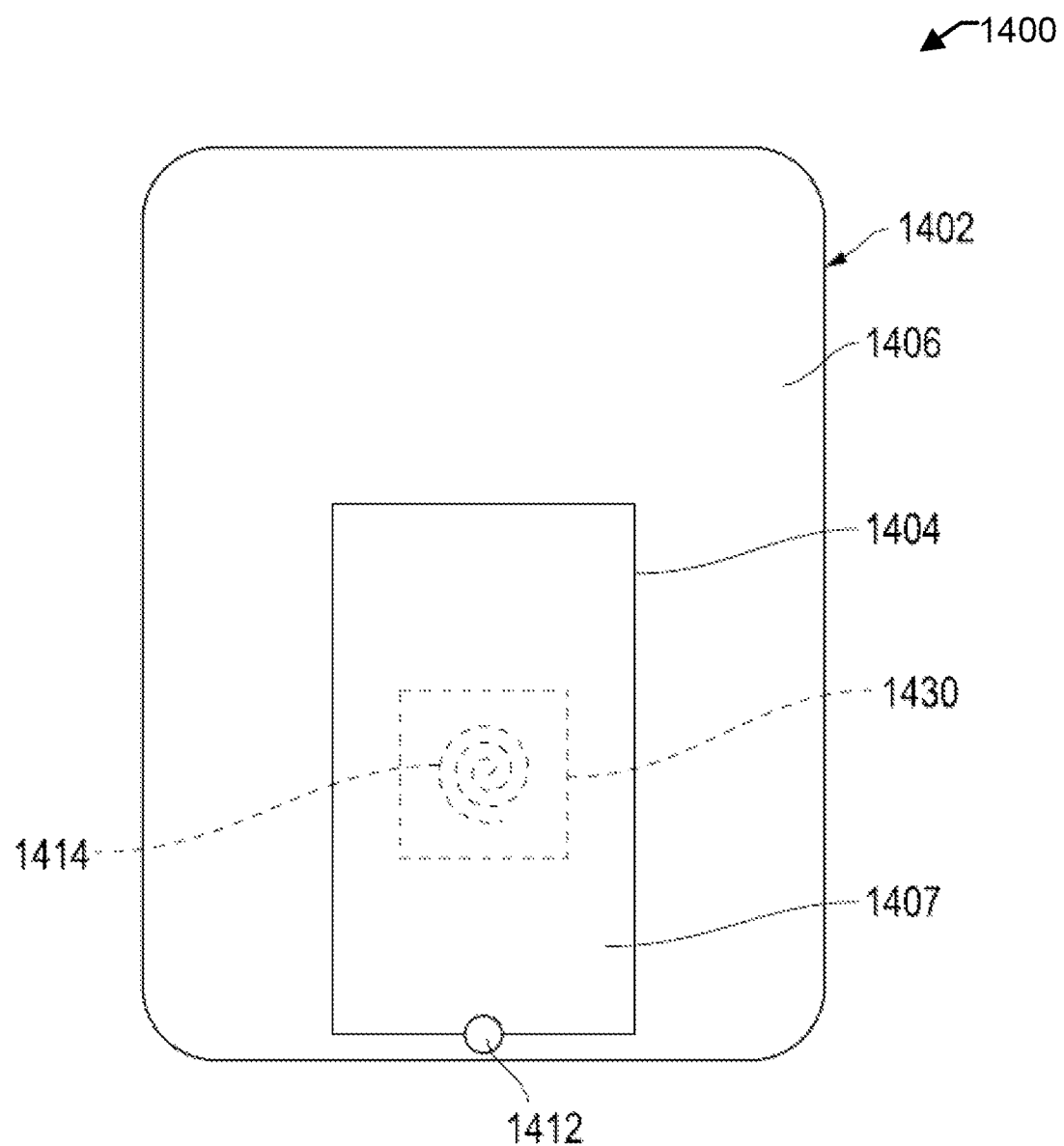
FIG. 14a is a diagram illustrating a back side of a mobile computing device including an isolation marker according to an embodiment of the present disclosure.

FIGS. 14a-d show a mobile computing device 1400 according to an embodiment of the present disclosure. The mobile computing device 1400 includes a body 1402 and an articulating wireless power receiver or easel 1404. The body 1402 has a back side 1406 and a front side 1408. The mobile computing device 1400 includes a receiver coil 1414 and a magnetic shield 1404 within the wireless power receiver 1404. The wireless power receiver 1404 is preferably adapted to fit within an indentation 1410 formed in the back side 1406 of the mobile computing device 1400. The mobile computing device 1400 also includes an isolation marker 1430 in physical communication with a first surface 1405 of the wireless power receiver 1404. The wireless power receiver 1404 is normally biased, as shown in FIG. 14a, with the isolation marker 1430 and the first surface 1405 of the wireless power receiver in physical communication with the indentation 1410 and a second surface 1407 facing out from the mobile computing device 1400.

Figure 14B:
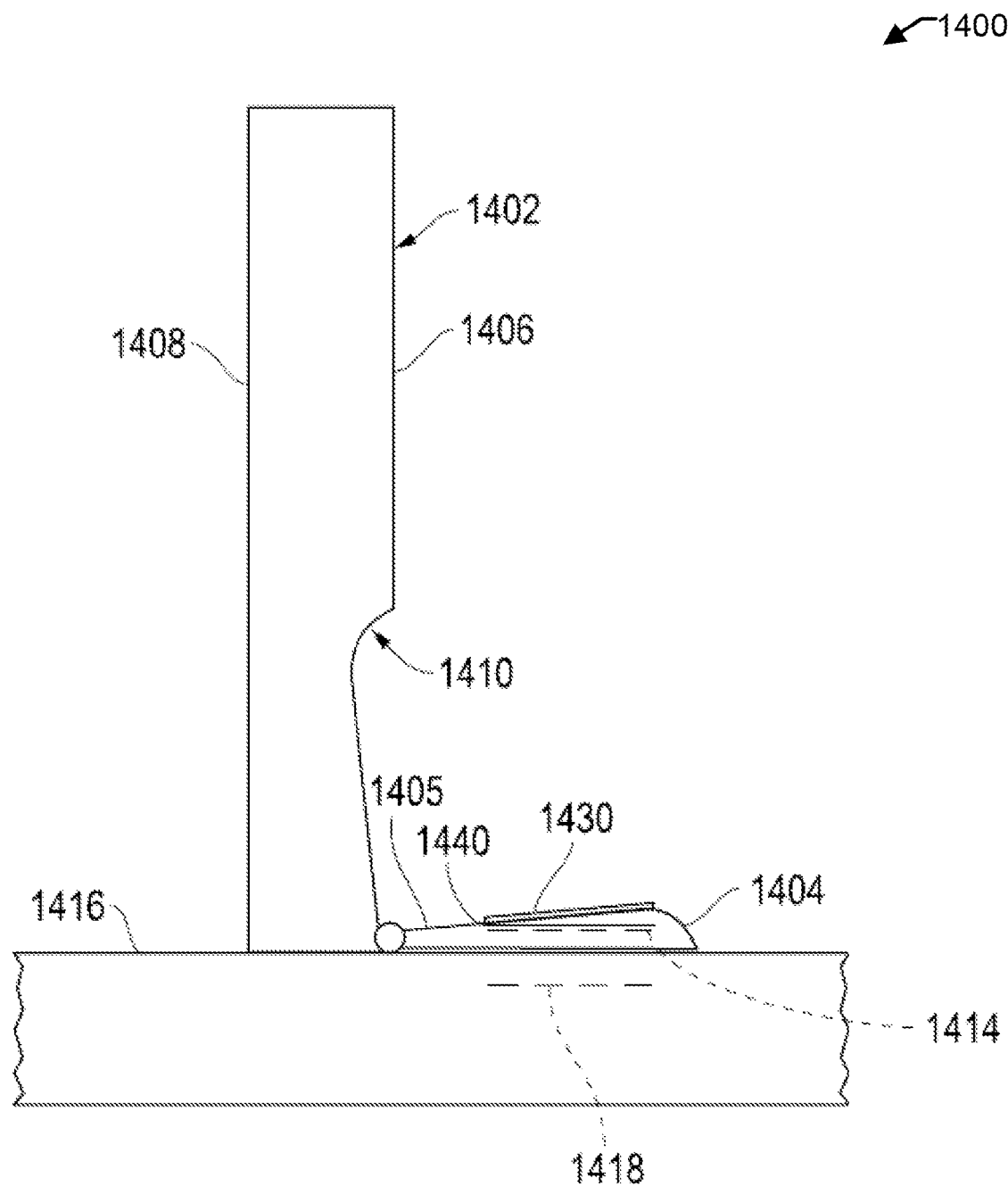
FIG. 14b is a diagram illustrating a side view of the mobile computing device with the wireless power receiver and isolation marker deployed to a first position according to an embodiment of the present disclosure.

In order that the mobile computing device 1400 may be wirelessly recharged, the wireless power receiver 1404 may be provided with a wireless power receiver coil 1414. The wireless power receiver 1404 may be rotated about an axis extending out of the page as shown in FIG. 14b so that the receiver coil 1414 can be brought into opposition with a transmission coil 1418 in a charging pad 1416 via a hinge 1412 as described with respect to hinge 1312 in FIGS. 13a-13d above. Thus, power wirelessly transmitted from the coil 1418 to the coil 1414 may recharge a battery of the mobile computing device 1400. In an embodiment, the battery may be connected in well know fashion to the coil 1414. One of ordinary skill in the art would recognize that the wireless power receiver 1404 may extend from the mobile computing device 1400 in a variety of different manners or may be continuously extended from the mobile computing device without varying the scope of the isolation marker 1430.

During operation, the wireless power receiver coil 1414 is energized by a high frequency signal, which generates a magnetic field around wireless power receiver coil or inductor. When the wireless power receiver coil 1414 is placed within this magnetic field, a current is induced in the wireless power receiver coil 1414, and it is this current that can be used to provide power to the battery or other components of the mobile computing device 1400. In different embodiments, the wireless power receiver coil 1414 may or may not include a magnetic shield 1440 that can be implemented to reduce interference caused by a magnetic field generated by the wireless power receiver coil or in the vicinity of the wireless power receiver coil.

Figure 14C:
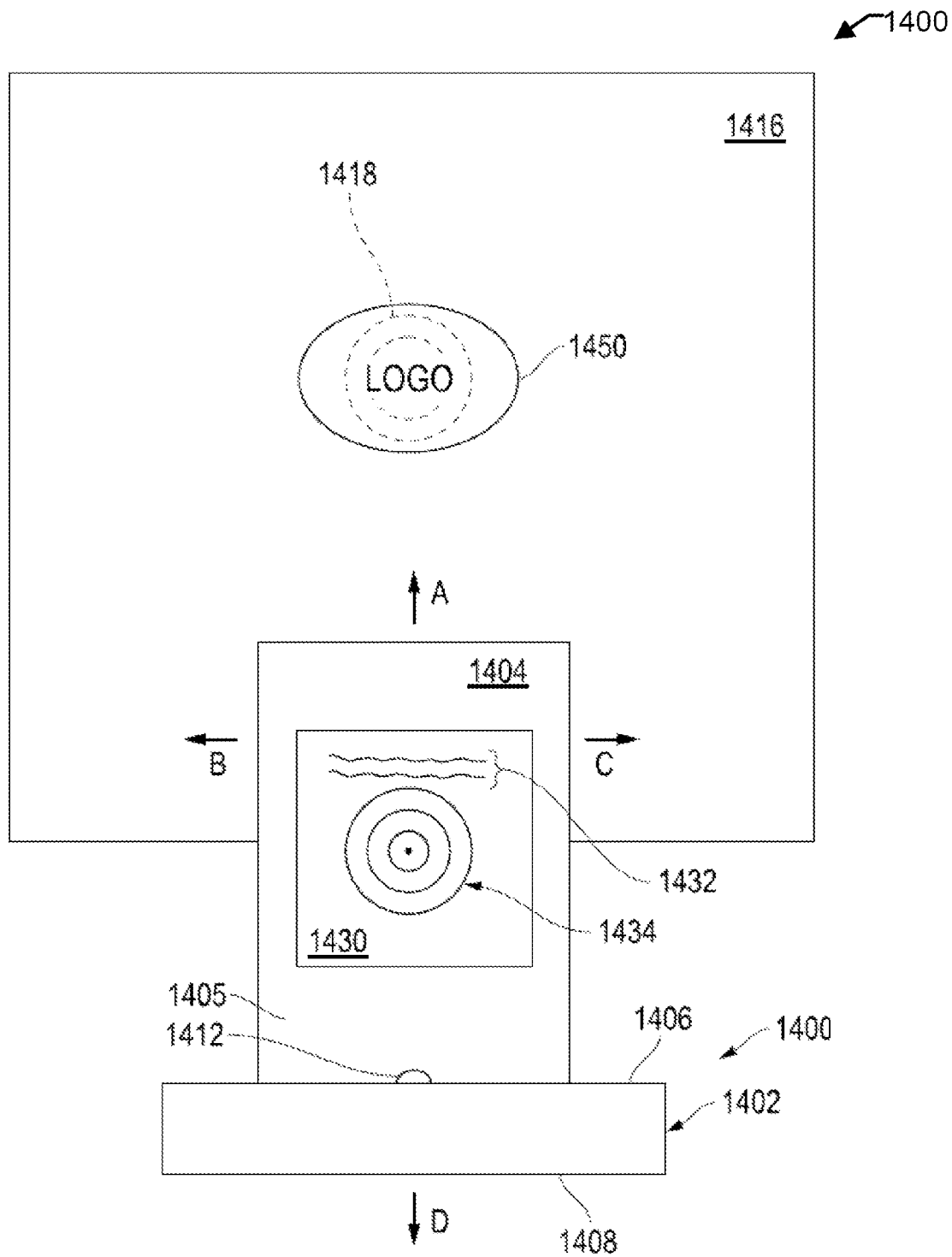
FIG. 14c is a diagram illustrating a top view of the mobile computing device in a first location on a wireless charging pad according to an embodiment of the present disclosure.
Figure 14D:
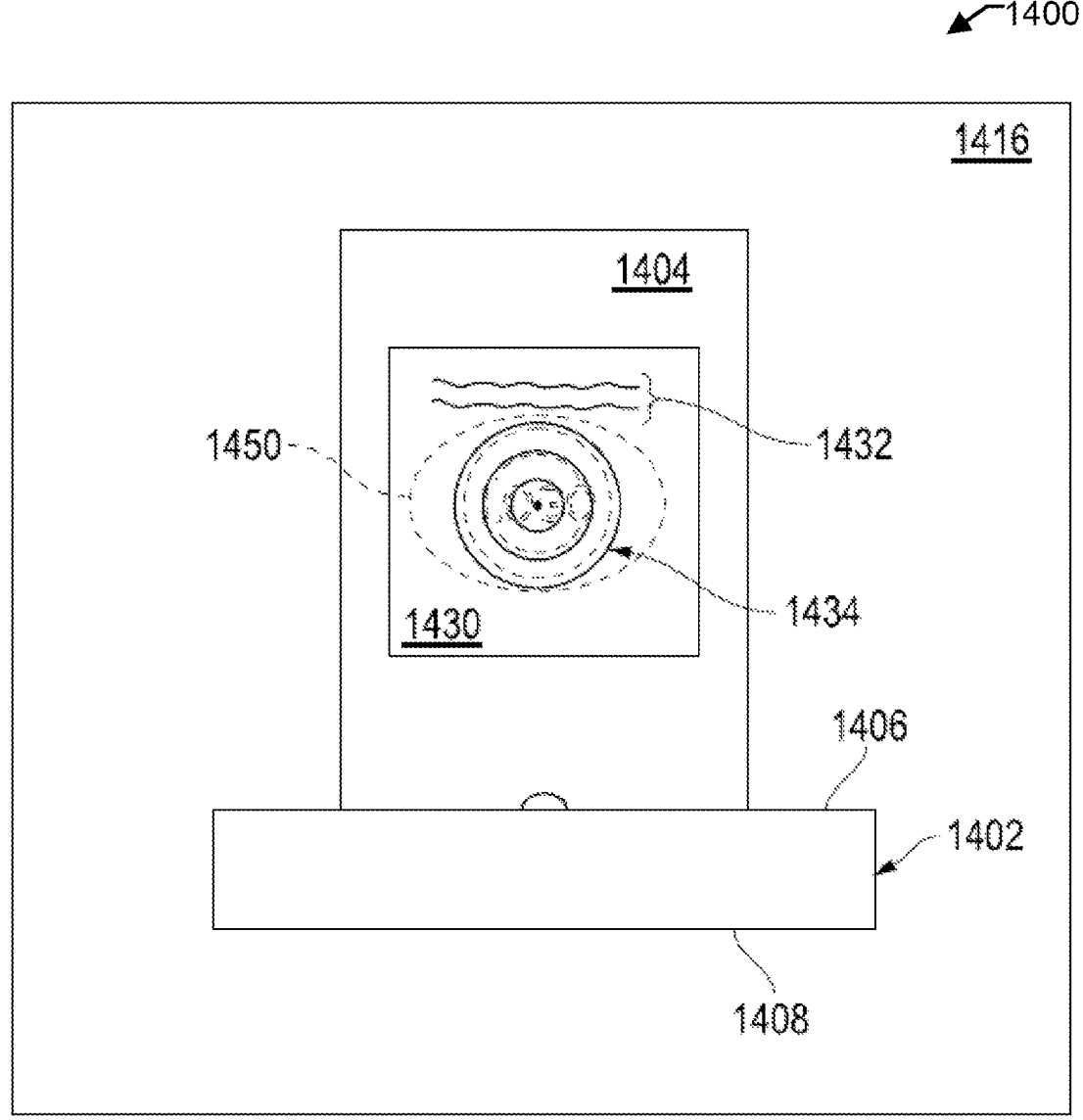
FIG. 14d is a diagram illustrating a top view of the mobile computing device in a second location on a wireless charging pad according to an embodiment of the present disclosure.

The isolation marker 1430 includes instructions 1432 and a marker 1434. In an embodiment, the instructions 1432 can provide an individual with directions as to how to utilize the wireless power receiver 1404 to charge the mobile computing device 1430. The instructions 1432 can include written instructions and/or pictures to describe how the wireless power receiver 1404 is utilized with respect to the wireless charging pad 1416. In an embodiment, the instructions 1432 can identify the steps the individual should perform to properly align the wireless power receiver coil 1414 with the transmission coil 1418 of the wireless charging pad 1416. For example, the instructions 1432 can include that the wireless power receiver 1404 may be extended to be perpendicular with the back side 1406 of the mobile computing device 1400, as shown in FIGS. 14b-14d, and then the marker 1434 can be positioned above a marker 1450 on the wireless charging pad 1416.

In an embodiment, the marker 1434 can mark or identify the location of the wireless power receiver coil 1414 within the wireless power receiver 1404. In an embodiment, the marker 1434 can be any design, such as a bulls-eye, to show the location of the receiver coil 1414. The wireless charging pad 1416 includes a marker 1450 above the transmission coil 1418 as shown in FIG. 14C. In an embodiment, the marker 1450 can be a logo of the manufacturer of the charging pad 1416, can be the logo of a company providing the charging pad for the use of its customers, or the like.

An individual can utilize the instructions 1432 and the marker 1434 of the isolation marker 1430 and the marker 1450 to line up the transmission coil 1418 and the receiver coil 1414. The individual can then move the wireless power receiver 1404 in any direction, such as the direction of arrows A, B, C, and D shown in FIG. 14C, to position the marker 1434 over marker 1450. When the marker 1434 of the wireless power receiver 1404 is located over the marker 1450 of the wireless charging pad 1416 as shown in FIG. 14D, the receiver coil 1414 is in a proper location over the transmission coil 1418.

In an embodiment, the isolation marker 1430 can be implemented as a magnetic shield to isolate or reduce interference caused by a magnetic field generated by the wireless power receiver coil or in the vicinity of the wireless power receiver coil, and can be also designed to manipulate a shape of a magnetic flux field generated by transmission coil 1418 in the charging pad 1416. In particular, isolation marker 1430 is included at a rear surface of a transmitting and at a rear surface of a receiving inductor, such that when a data processing device is placed on a wireless charging pad, the transmitting antenna and the receiving antenna are sandwiched between the magnetic shields. This arrangement causes the magnetic flux lines to be concentrated between the magnetic shields, thereby increasing flux density at the receiving coil and increasing power transfer efficiency. Furthermore, power transfer efficiency is decreased and undesirable heating can occur if the magnetic flux field intersects conductive material, such as metal parts included in the device being charged. Accordingly, isolation marker 1430 reduces an amount of magnetic flux that interacts with other portions of a charging pad, a device being charged, the individual placing the computing device 1400 on the charging pad 1416, or the like.

The isolation marker 1430 may include magnetic materials, such as ferrites, which can influence magnetic fields in its environment. Materials such as ferrite have a greater permeability to magnetic fields than the air around them and therefore concentrate the magnetic field lines around the wireless power receiver coil 1414. Thus, isolation marker 1430 may aid an individual in properly locating the receiver coil 1414 directly over the transmission coil 1418 to provide optimal charging of the mobile computing device 1400. Additionally, the isolation marker 1430 can isolate the magnetic field in receiver coil 1404, such that the magnetic field does not pass through the wireless power receiver 1404 and extend to an individual's hand as the individual places the receiver coil 1404 directly over the transmission coil 1418.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system can be a personal computer, a consumer electronic device, a network server or storage device, a switch router, wireless router, or other network communication device, a network connected device (cellular telephone, tablet device, etc.), or any other suitable device, and can vary in size, shape, performance, price, and functionality.

The information handling system can include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system can include one or more storage devices, one or more communications ports for communicating with external devices, as well as, various input and output (I/O) devices, such as a keyboard, a mouse, a video/graphic display, or any combination thereof. The information handling system can also include one or more buses operable to transmit communications between the various hardware components. Portions of an information handling system may themselves be considered information handling systems.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A method comprising:
    incorporating a carbon material and a ferrous magnetic material at a magnetic shield immediately adjacent to a wireless power antenna at a wireless power transmission system, the magnetic shield to shape a magnetic flux field proximate to the magnetic shield, the carbon material to provide thermal conductivity at the magnetic shield to conduct heat generated at the wireless power antenna to a heat sink.

2. The method of claim 1, wherein the carbon material provides orthotropic thermal conductivity and is arranged to conduct heat in a direction parallel to a primary plane of the magnetic shield.

3. The method of claim 1, wherein the carbon material is arranged to conduct heat in a direction perpendicular to the primary plane of the magnetic shield.

4. The method of claim 1, wherein the carbon material includes carbon nanotubes.

5. The method of claim 1, wherein the carbon material includes graphite.

6. The method of claim 1, wherein incorporating the carbon material at the magnetic shield comprises laminating a first sheet including the ferrous magnetic material and a second sheet including the carbon material, a wireless power inductor to attach to a major surface of the first sheet opposite the second sheet.

7. The method of claim 1, wherein incorporating the carbon material at the magnetic shield comprises distributing chopped carbon nanotubes and the ferrous magnetic material homogeneously in a binder.

8. The method of claim 1, wherein incorporating the carbon material at the magnetic shield comprises arranging a plurality of carbon nanotubes in a substantially parallel orientation within a binder, the binder further including a distribution of powdered iron or a powdered ferrite.

9. The method of claim 1, wherein incorporating the carbon material at the magnetic shield comprises mixing carbon nanotubes in a binder to provide a mixture, and applying the mixture to a first major surface of a sheet of material containing powdered iron or a powdered ferrite, a wireless power inductor to attach to a second major surface opposite the first major surface.

10. A wireless power transmission system including a wireless power antenna device, the wireless power antenna device comprising:
    an inductor;
    a magnetic shield located immediately adjacent to the wireless power antenna, the magnetic shield including a ferrous magnetic material and a carbon material, the ferrous magnetic material to shape a magnetic flux field at the inductor, the carbon material to provide thermal conductivity at the magnetic shield to conduct heat generated at the inductor to the heat sink; and
    a heat sink coupled to the magnetic shield.

11. The device of claim 10, wherein the carbon material provides orthotropic thermal conductivity and is arranged to conduct heat in a direction parallel to a primary plane of the magnetic shield.

12. The device of claim 10, wherein the carbon material is arranged to conduct heat in a direction perpendicular to the primary plane of the magnetic shield.

13. The device of claim 10, wherein the carbon material includes carbon nanotubes.

14. The device of claim 10, wherein the carbon material includes graphite.

15. The device of claim 10, wherein the magnetic shield further comprises a lamination of a first sheet including the ferrous magnetic material and a second sheet including the carbon material, the first sheet adjacent to the inductor.

16. The device of claim 10, wherein the ferrous magnetic material is included in a first sheet and the carbon material, suspended in an adhesive carrier is applied to a primary surface of the first sheet opposite the major surface to which the inductor is attached.

17. The device of claim 10, wherein the inductor is a wireless power source antenna to transmit power to a target antenna, or a wireless power target antenna to receive power from a wireless power source antenna.

18. The device of claim 10, wherein the ferrous magnetic material includes powdered iron or a ferrite material.

19. A wireless charging system comprising:
a wireless charging controller; and
a wireless charging antenna assembly coupled to the wireless charging controller, the antenna assembly including:
an inductor; and
a magnetic shield located immediately adjacent to the wireless power antenna, the magnetic shield including a ferrous magnetic material and a carbon material, the ferrous magnetic material to shape a magnetic flux field at the inductor, the carbon material to provide thermal conductivity at the magnetic shield.

20. The wireless charging system of claim 19, wherein the ferrous magnetic material is included in a first sheet and the carbon material, suspended in an adhesive carrier is applied to a primary surface of the first sheet opposite the major surface to which the inductor is attached.

* * * * *